United States Patent
Uddin et al.

(10) Patent No.: US 11,731,871 B2
(45) Date of Patent: Aug. 22, 2023

(54) ACTUATOR LAYER PATTERNING WITH POLYSILICON AND ETCH STOP LAYER

(71) Applicant: InvenSense, Inc., San Jose, CA (US)

(72) Inventors: Ashfaque Uddin, San Jose, CA (US); Daesung Lee, San Jose, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 174 days.

(21) Appl. No.: 17/334,493

(22) Filed: May 28, 2021

(65) Prior Publication Data
US 2022/0380209 A1   Dec. 1, 2022

(51) Int. Cl.
*B81C 1/00* (2006.01)
*B81B 3/00* (2006.01)
*B81B 7/00* (2006.01)
*B81B 7/02* (2006.01)

(52) U.S. Cl.
CPC .......... *B81C 1/00801* (2013.01); *B81B 3/001* (2013.01); *B81B 7/0025* (2013.01); *B81B 7/02* (2013.01); *B81C 1/00968* (2013.01); *B81B 2201/0235* (2013.01); *B81B 2201/0242* (2013.01); *B81B 2203/0127* (2013.01); *B81B 2207/012* (2013.01); *B81C 2201/014* (2013.01); *B81C 2201/0132* (2013.01); *B81C 2203/036* (2013.01); *B81C 2203/0792* (2013.01)

(58) Field of Classification Search
CPC .......... B81C 1/00801; B81C 1/00968; B81C 2201/0132; B81C 2201/014; B81C 2203/036; B81C 2203/0792; B81C 2201/056; B81B 3/001; B81B 7/0025; B81B 7/02; B81B 2201/0235; B81B 2201/0242; B81B 2203/0127; B81B 2207/012
See application file for complete search history.

(56) References Cited

U.S. PATENT DOCUMENTS

| | | | |
|---|---|---|---|
| 9,290,376 B1 * | 3/2016 | Cheng | B81C 1/00238 |
| 2014/0206123 A1 * | 7/2014 | Chu | B81C 1/00039 |
| | | | 438/51 |
| 2021/0070608 A1 * | 3/2021 | Kang | B81C 1/00968 |
| 2021/0107785 A1 * | 4/2021 | Lee | B81C 1/00238 |

FOREIGN PATENT DOCUMENTS

| | | |
|---|---|---|
| DE | 102019202794 | 11/2019 |
| TW | 201443977 A | 11/2014 |
| TW | 201736241 A | 10/2017 |
| TW | 202009209 A | 3/2020 |
| TW | 202016008 A | 5/2020 |

OTHER PUBLICATIONS

PCT/US2022/020333 Filed Mar. 15,2022—PCT International Search Report and Written Opinion, dated Jun. 23, 2022, 11 pages.
TW 1st Office Action and Search Report dated Feb. 23, 2023.

* cited by examiner

*Primary Examiner* — Yasser A Abdelaziez

(57) ABSTRACT

A method includes forming an etch stop layer over a first side of a device wafer. The method also includes forming a polysilicon layer over the etch stop layer. A handle wafer is fusion bonded to the first side of the device wafer. A eutectic bond layer is formed on a second side of the device wafer. A micro-electro-mechanical system (MEMS) features are etched into the second side of the device wafer to expose the etch stop layer. The exposed etch stop layer is removed to expose the polysilicon layer. The exposed polysilicon layer is removed to expose a cavity formed between the handle wafer and the device wafer.

24 Claims, 16 Drawing Sheets

ACTUATOR LAYER PATTERNING WITH POLYSILICON AND ETCH STOP LAYER

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc.

It is appreciated that actuator etch defines critical MEMS features. The etch rate of silicon in features varies significantly due to difference in pattern density and aspect ratio. As such, actuator features (also referred to as features throughout this application) are released at different times during the etch process. Some features that are released earlier may tilt and bend due to gravitational force, electrical charge force, etc. Moreover, the sidewalls of the released features are often tapered and damaged from the etch process because of the tilt. The release of the features at different times that result in tilting/bending and tapered and/or damaged sidewalls results in parametric degradation or device failures.

SUMMARY

Accordingly, a need has arisen to prevent actuator features from tilting and being damaged from the etch process. As such, an etch stop layer and a polysilicon layer is introduced on the device wafer. Oxide and polysilicon layers act as tether for actuator features when silicon is completely removed from the actuator features and therefore prevent tilting of proof mass and sidewall damage in the actuator features during the etch process. The etch stop layer may be an oxide layer such as silicon dioxide that acts as an etch stop for actuator features since oxide has a high etch selectivity with respect to silicon. The polysilicon layer provides structural robustness to the etch stop layer, preventing thin oxide layer from cracking or breaking during the etch process. In some embodiments, the polysilicon layer also serves as a bonding material for fusion bond between the device wafer and the handle wafer. Having polysilicon layers on both sides of the actuator wafer can also balance the stress level in the actuator wafer. After silicon is completely removed from all features, actuator features are released simultaneously in a controlled manner by etching oxide and polysilicon in final step. Controlled and simultaneous release of the actuator features prevents the bending and/or tilting of features that can lead to tapered or damaged sidewalls inside features, thereby improving parametric performance and preventing device failures.

Provided herein is a method includes depositing an etch stop layer, e.g., silicon dioxide layer, over a first side of a device wafer. A polysilicon layer is deposited over the etch stop layer and polished to create a flat surface. A handle wafer is fusion bonded to the device wafer. A standoff is formed on a second side of the device wafer. A eutectic bond layer, e.g., Ge, is formed over the standoff. A micro-electro-mechanical system (MEMS) features are etched into the second side of the device wafer to expose the etch stop layer. A portion of the etch stop layer and a portion of the polysilicon layer that correspond to the features are removed to expose a cavity formed between the handle wafer and the device wafer.

In some embodiments, a rough poly-silicon layer is deposited directly on the second side of the device wafer prior to forming the eutectic bond layer. It is appreciated that the etch stop layer may be patterned. In some embodiments, the polysilicon layer is formed over the patterned etch stop layer and is further formed over an exposed portion on the first side of the device wafer. It is appreciated that a fusion bond layer, e.g., oxide layer, may be formed on a side of the handle wafer that is fusion bonded to the polysilicon layer. The fusion bond layer may cover an interior surface of the cavity, and wherein the method further comprises forming a self-assembled monolayer (SAM) coating over the interior surface of the cavity that is coated with fusion bond layer, and further forming the SAM coating over the features. In some embodiments, the fusion bond layer covers an interior surface of the cavity, and wherein the method further comprises removing the fusion bond layer from the interior surface of the cavity after removing the portion of the etch stop layer and the portion of the polysilicon layer. In some embodiments, vapor hydrogen fluoride (VHF) is used to remove the fusion bond layer from the cavity. According to one embodiment, a SAM coating may be formed over the interior surface of the cavity after removing the fusion bond layer from the interior surface of the cavity, and further forming the SAM coating over the features. In some embodiments, the fusion bond layer may be formed over the polysilicon layer. It is further appreciated that the eutectic bond layer of the device wafer may be eutecticly bonded to a complementary metal-oxide semiconductor (CMOS).

In some embodiments, a method includes forming an etch stop layer over a first side of a device wafer. The method also includes forming a polysilicon layer over the etch stop layer. A handle wafer is fusion bonded to the first side of the device wafer. A eutectic bond layer is formed on a second side of the device wafer. A micro-electro-mechanical system (MEMS) features are etched into the second side of the device wafer to expose the etch stop layer. The exposed etch stop layer is removed to expose the polysilicon layer. The exposed polysilicon layer is removed to expose a cavity formed between the handle wafer and the device wafer.

In some embodiments, the method further includes depositing a rough poly-silicon layer directly on the second side of the device wafer prior to forming the eutectic bond layer. Accordingly to some embodiments, the etch stop layer is patterned and the polysilicon layer is formed over the patterned etch stop layer and is further formed over an exposed portion on the first side of the device wafer. The method may further include forming a fusion bond layer on a side of the handle wafer that is fusion bonded to the polysilicon layer. The fusion bond layer may be an oxide layer and it may cover an interior surface of the cavity, and wherein the method further comprises forming a SAM coating over the interior surface of the cavity that is coated with fusion bond layer, and further forming the SAM coating over the features. In some embodiments, the fusion bond layer covers an interior surface of the cavity, and wherein the method further comprises removing the fusion bond layer from the interior surface of the cavity after removing the exposed etch stop layer and the exposed polysilicon layer. According to some embodiments, a SAM coating is formed over the cavity after removing the fusion bond layer from the interior surface of the cavity, and further forming the SAM coating over the features. According to some embodiments, the method further includes forming a fusion bond layer over the polysilicon layer.

In some embodiments a device includes a handle wafer having a first side that is opposite to a second side. The device may also include a device wafer having a first side that is opposite to a second side, wherein the first side of the device wafer is fusion bonded to the first side of the handle wafer and forms a cavity. The device wafer comprises a MEMS features, wherein a top layer of the features include a polysilicon layer exposed to an interior surface of the cavity and wherein at least a portion of the polysilicon layer is formed over an etch stop layer and wherein the etch stop layer and the polysilicon layer are formed over an actuator layer of the device wafer. The device may also include a rough poly-silicon layer disposed directly on the second side of the device wafer. It is appreciated that in some embodiments, the features and the cavity are coated with SAM coating. It is further appreciated that the interior surface of the cavity may be covered with an oxide layer. According to some embodiments, the features and the cavity covered with the oxide layer are coated with SAM coating. In some embodiments, a CMOS is eutecticly bonded to the device wafer.

These and other features and advantages will be apparent from a reading of the following detailed description.

DESCRIPTION

Figure 1:
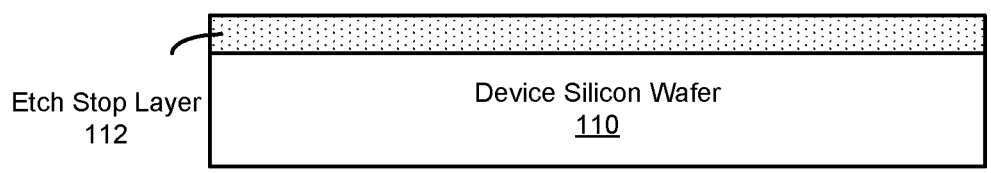
FIG. 1 shows a MEMS wafer with an etch stop layer at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

As described above, actuator etch defines critical MEMS features and the etch rate of silicon in features varies significantly due to difference in pattern density and aspect ratio. As such, actuator features (also referred to as MEMS features throughout this application) are released at different times during the etch process. For example, smaller actuator features may take a longer time to etch and release in comparison to larger actuator features because the aspect ratio (i.e. ratio of height to width of a trench for example) of larger actuator features is less in comparison to smaller actuator features. Therefore, larger actuator features etch and release faster when they are exposed to etching compound in comparison to smaller actuator features. As described above, some features that are released earlier may tilt and bend due to gravitational force, electrical charge force, etc., resulting in tapered or damaged sidewalls resulting in parameter degradation or device failures.

In order to address the need to prevent actuator features from tilting and being damaged from the etch process, an etch stop layer and a polysilicon layer is introduced on the device wafer. Oxide and polysilicon layers act as tether for actuator features when silicon is completely removed from the actuator features and therefore prevent tilting of proof mass and sidewall damage in the actuator features during the etch process. The etch stop layer may be an oxide layer such as silicon dioxide that acts as an etch stop for actuator features since oxide has a high etch selectivity with respect to silicon. The polysilicon layer provides structural robustness to the etch stop layer, preventing thin oxide layer from cracking or breaking during the etch process. In some embodiments, the polysilicon layer also serves as a bonding material for fusion bond between the device wafer and the handle wafer. Having polysilicon layers on both sides of the actuator wafer can also balance the stress level in the actuator wafer. After silicon is completely removed from all features, actuator features are released simultaneously in a controlled manner by etching oxide and polysilicon in final step.

FIG. 1 shows a MEMS wafer with an etch stop layer at an early stage of manufacture according to one aspect of the present embodiments. In some embodiments, an etch stop layer 112 that comprises oxide may be deposited over a device silicon wafer 110 (may also be referred to as the actuator layer). In some embodiments, the etch stop layer 112 may be a low-stress silicon dioxide that acts as an etch stop layer for MEMS features to be formed during actuator etch process. It is appreciated that the MEMS features will ultimately be formed in the device silicon wafer 110.

Figure 2:
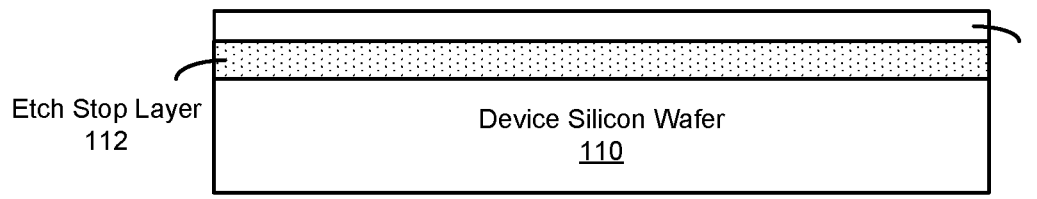
FIG. 2 shows the MEMS wafer after mask deposition according to one aspect of the present embodiments.

FIG. 2 shows the MEMS wafer after mask deposition according to one aspect of the present embodiments. In this embodiment, the etch stop layer 112 is being patterned. As such, a mask 114 is deposited over the etch stop layer 112. Mask 114 may comprise a photoresist. It is appreciated that the patterning the etch stop layer 112 may correspond to the actuator features area. In other words, the etch stop layer 112 that correspond to the actuator features are maintained while other portions of the etch stop layer 112 is removed.

Figure 3:
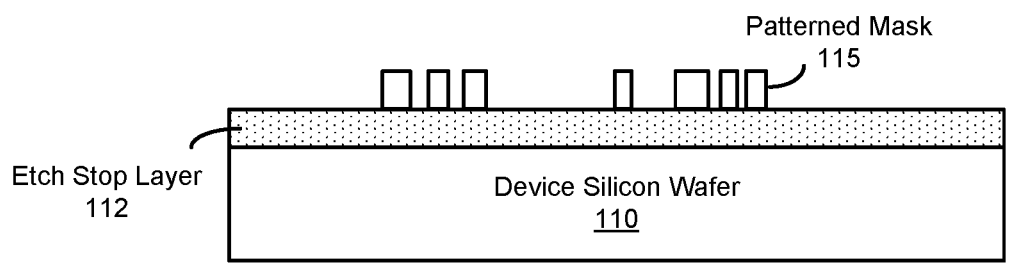
FIG. 3 shows the MEMS wafer after patterning the mask according to one aspect of the present embodiments.

FIG. 3 shows the MEMS wafer after patterning the mask according to one aspect of the present embodiments. In this embodiment, the mask 114 is patterned to form a patterned mask 115.

Figure 4:
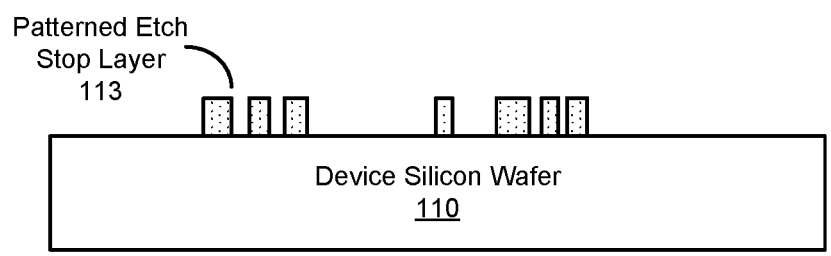
FIG. 4 shows the MEMS wafer after patterning the etch stop layer according to one aspect of the present embodiments.

FIG. 4 shows the MEMS wafer after patterning the etch stop layer according to one aspect of the present embodiments. In this embodiment, the etch stop layer 112 that is exposed (i.e. not covered by the patterned mask 115) is removed, thereby exposing the top surface of the device silicon wafer 110. Once the exposed etch stop layer 112 is removed, the patterned mask 115 is removed leaving behind the patterned etch stop layer 113.

Figure 5:
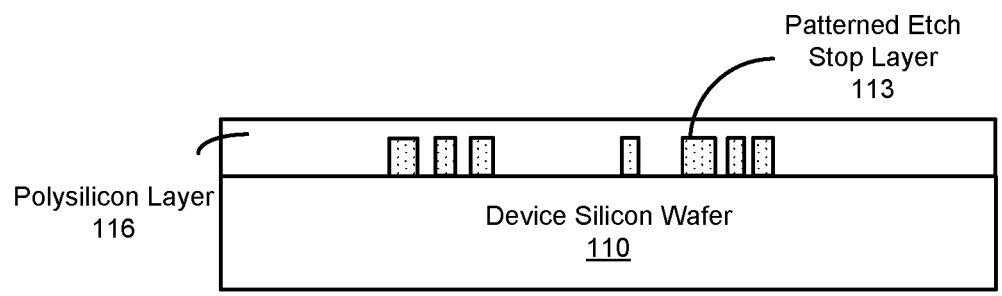
FIG. 5 shows the MEMS wafer after formation of a polysilicon layer over the etch stop layer according to one aspect of the present embodiments.

FIG. 5 shows the MEMS wafer after formation of a polysilicon layer over the etch stop layer according to one aspect of the present embodiments. In some embodiments, a polysilicon layer 116 is formed over the patterned etch stop layer 113 (i.e. covering the patterned etch stop layer 113) and it is further formed over the exposed surface portion of the device silicon wafer 110. It is appreciated that the polysilicon layer 116 provides mechanical support for the patterned etch stop layer 113 during the etch process that forms the actuator features and prevents the patterned etch stop layer 113 from cracking or breaking during the etch process. It is appreciated that the polysilicon layer 116 may also be used as bonding material for fusion bonding the device silicon wafer 110 to the handle silicon wafer (described later). In some embodiments, the polysilicon layer 116 may be polished to prepare a flat polysilicon surface for fusion bonding with the handle silicon wafer that is described later.

Figure 6:
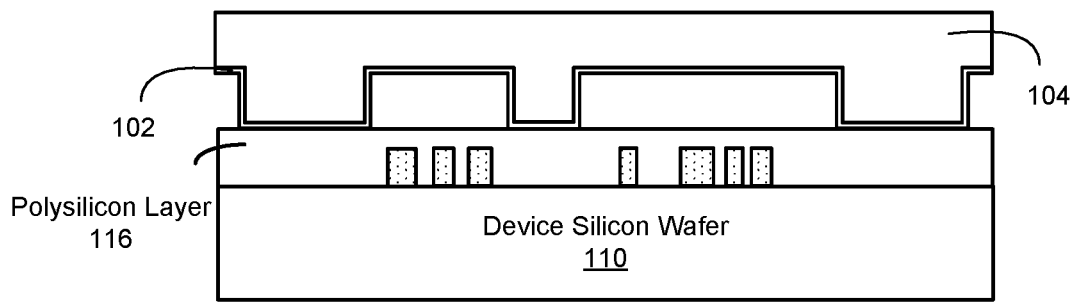
FIG. 6 shows the MEMS wafer after fusion bonding with a handle wafer according to one aspect of the present embodiments.

FIG. 6 shows the MEMS wafer after fusion bonding with a handle wafer according to one aspect of the present embodiments. In some embodiments, a fusion bond oxide 102 fusion bonds a handle silicon wafer 104 to a first side of a device silicon wafer 110 (i.e. the polysilicon layer 116). A second side of the device silicon wafer 110 is planar and opposite the first side. It is appreciated that the second side of the device silicon wafer 110 may be grinded and polished to create a thin device layer. Moreover, it is appreciated that fusion bonding the device silicon wafer 110 to the handle silicon wafer 104 forms at least one cavity between the two wafers. In some embodiments, one cavity may be used for accelerometer measurements while another cavity may be used for gyroscope measurements.

Figure 7:
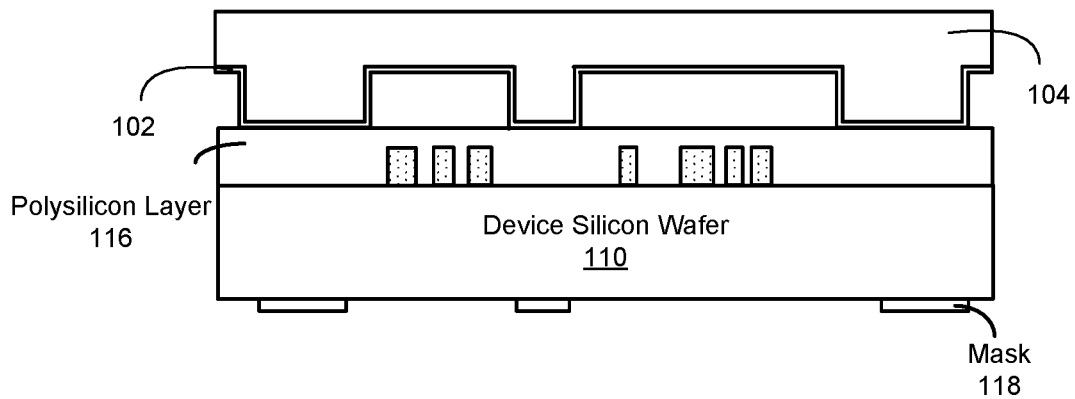
FIG. 7 shows the MEMS wafer after formation of a mask corresponding to a standoff according to one aspect of the present embodiments.

FIG. 7 shows the MEMS wafer after formation of a mask corresponding to a standoff according to one aspect of the present embodiments. In some embodiments, mask 118 may be deposited on the second side of the device silicon wafer 110 and patterned to correspond to location of the standoff. In this embodiment, three standoffs are being formed. However, the number of standoffs is merely for illustrative purposes and should not be construed as limiting the scope of the embodiments.

Figure 8:
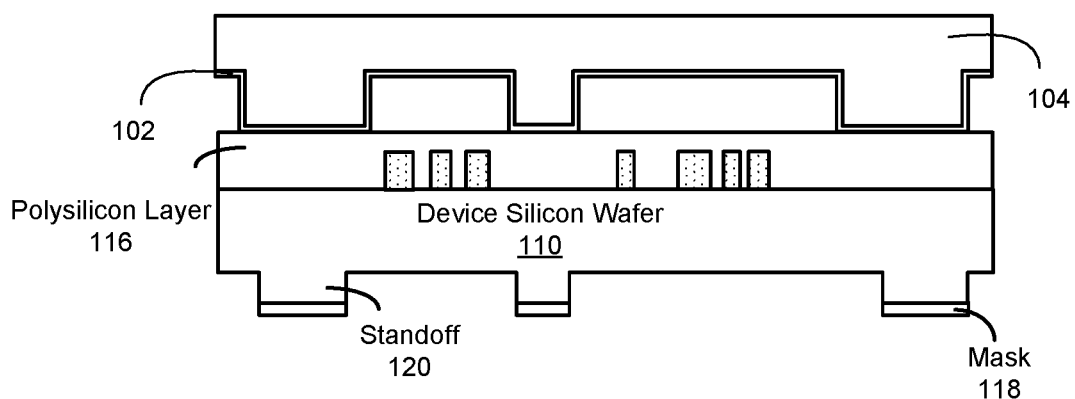
FIG. 8 shows the MEMS wafer after forming a standoff according to one aspect of the present embodiments.

FIG. 8 shows the MEMS wafer after forming a standoff according to one aspect of the present embodiments. Once mask 118 is formed that corresponds to location of standoffs, the second side of the device silicon wafer 110 is etched, thereby forming the standoffs 120.

Figure 9:
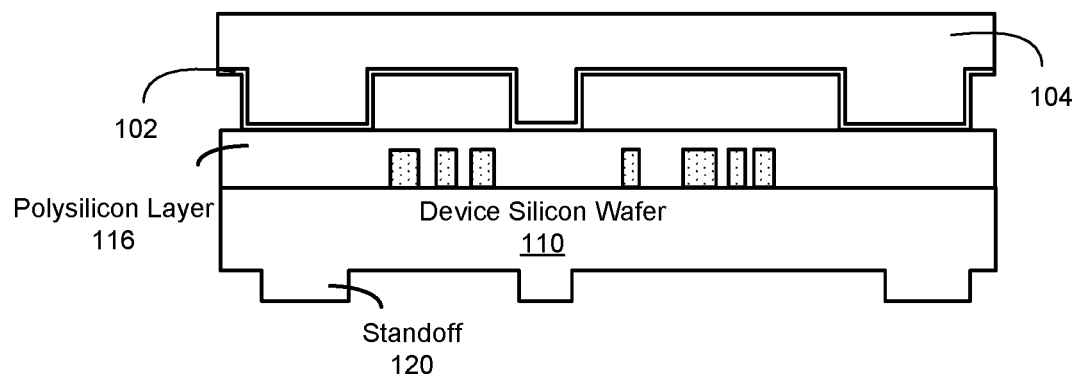
FIG. 9 shows the MEMS wafer after removing the mask once a standoff is formed according to one aspect of the present embodiments.

FIG. 9 shows the MEMS wafer after removing the mask once a standoff is formed according to one aspect of the present embodiments. Once the standoffs 120 are formed, the mask 118 may be removed.

Figure 10:
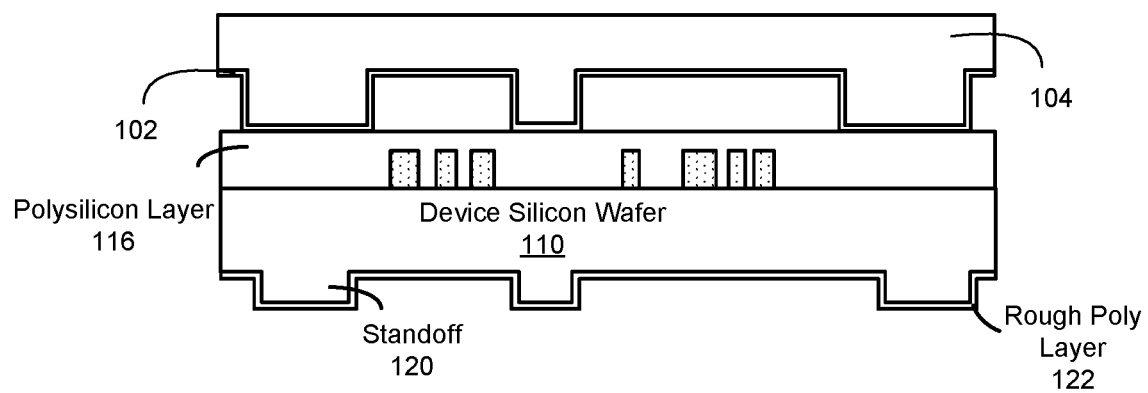
FIG. 10 shows the MEMS wafer after deposition of rough polysilicon to improve stiction according to one aspect of the present embodiments.

FIG. 10 shows the MEMS wafer after deposition of rough polysilicon to improve stiction according to one aspect of the present embodiments. In some embodiments, a rough polysilicon layer 122 is deposited on the second side of the device silicon wafer 110. In some embodiments, the rough polysilicon layer 122 is deposited directly on the second side of the device silicon wafer 110. It is appreciated that the rough polysilicon layer 122 is optional and it improves stiction. In other embodiments, the rough polysilicon layer 122 may be absent. It is appreciated that the rough polysilicon layer 122 may be substituted with a different material in order to improve stiction.

Figure 11:
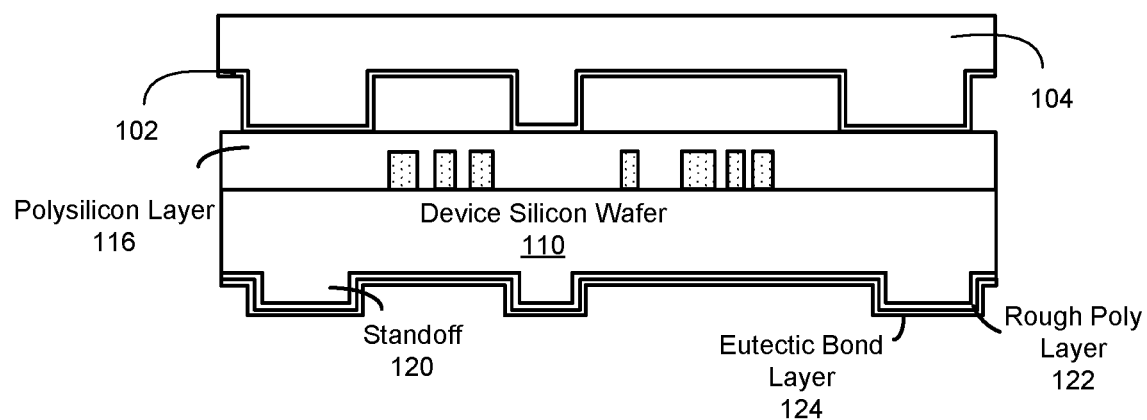
FIG. 11 shows the MEMS wafer after forming a eutectic bond layer according to one aspect of the present embodiments.

FIG. 11 shows the MEMS wafer after forming a eutectic bond layer according to one aspect of the present embodiments. A eutectic bond layer 124, e.g., Germanium, Aluminum, etc., may be deposited the rough polysilicon layer 122. It is appreciated that since use of the rough polysilicon layer 122 is optional in embodiments where no rough polysilicon layer 122 is used the eutectic bond layer 124 is deposited directly on the second side of the device silicon wafer 110. In some embodiments, the eutectic bond layer 124 is formed through a sputtering process.

Figure 12:
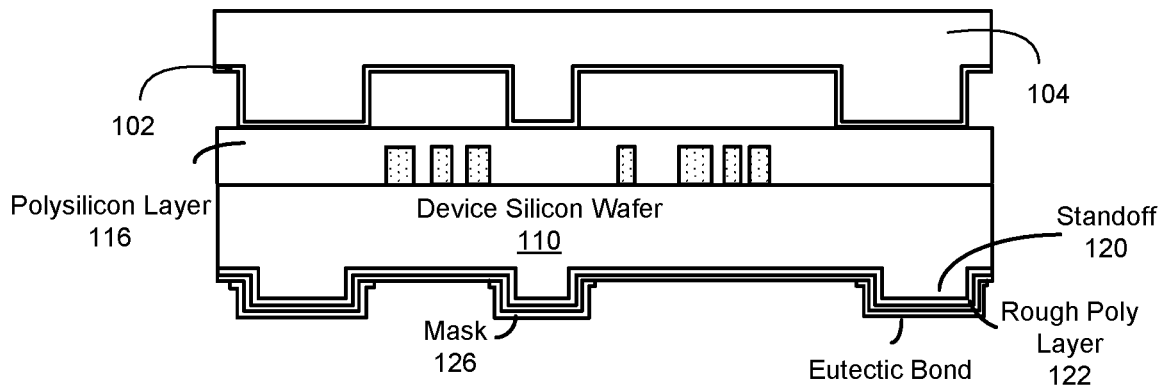
FIG. 12 shows the MEMS wafer after forming a mask on the eutectic bond layer of a standoff according to one aspect of the present embodiments.

FIG. 12 shows the MEMS wafer after forming a mask on the eutectic bond layer of a standoff according to one aspect of the present embodiments. In this embodiment, the mask 126 (may be a photoresist) is deposited/patterned to cover a portion of the eutectic bond layer 124 that corresponds to the standoff. The mask 126 protects the eutectic bond layer 124 that lies underneath that covers the standoffs 120. Accordingly, the quality of the eutectic bond layer is not compromised for later eutectic bonding to a complementary metal-oxide semiconductor (CMOS) at a later stage. It is appreciated that in some embodiments, the mask 126 may be formed over the eutectic bond layer 124 and subsequently patterned to maintain the mask 126 that cover the standoffs 120 while other portions are removed exposing the eutectic bond layer 124 that does not cover the standoffs 120.

Figure 13:
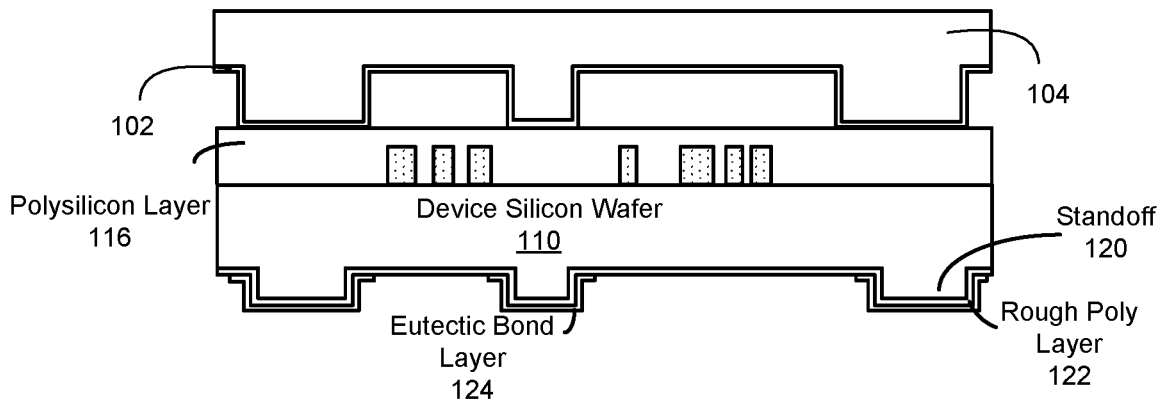
FIG. 13 shows the MEMS wafer after etching the exposed eutectic bond layer and after removal of the mask that protected the standoff according to one aspect of the present embodiments.

FIG. 13 shows the MEMS wafer after etching the exposed eutectic bond layer and after removal of the mask that protected the standoff according to one aspect of the present embodiments. The exposed portion of the eutectic bond layer 124 (i.e. portions that are not covered by the mask 126) are removed (i.e. etched) exposing the rough polysilicon layer 122 underneath. It is appreciated that in the embodiments that the rough polysilicon layer 122 is not used, once the eutectic bond layer 124 that is exposed is removed the surface of the second side of the device silicon wafer 110 is exposed. Once the exposed portion of the eutectic bond layer 124 is removed, the mask 126 may be removed that expose the eutectic bond layer 124 covering the standoffs 120.

Figure 14:
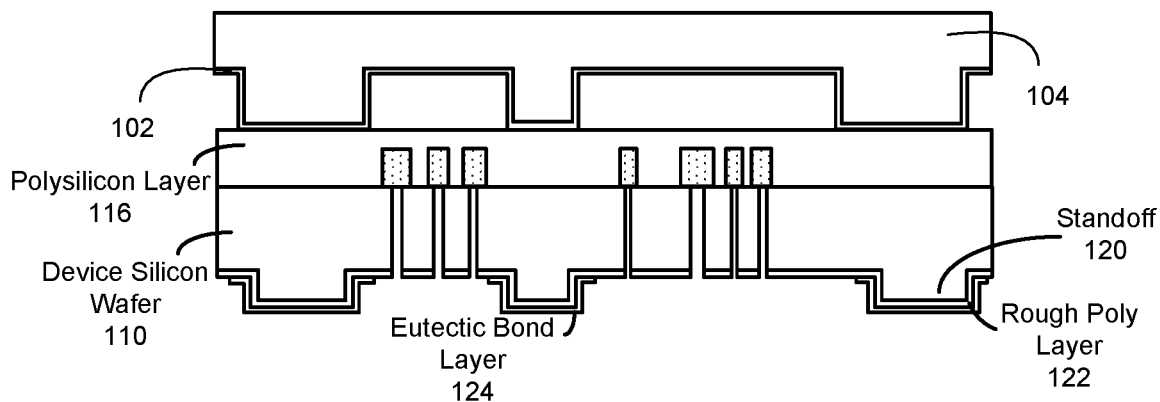
FIG. 14 shows the MEMS wafer after etching MEMS features to expose the etch stop layer according to one aspect of the present embodiments.

FIG. 14 shows the MEMS wafer after etching MEMS features to expose the etch stop layer according to one aspect of the present embodiments. The MEMS features (i.e. actuator features) are etched. In some embodiments, a mask (not shown) is applied on the second side of the device silicon wafer 110, patterned and the exposed portions of the rough polysilicon layer 122 and/or the second side of the device silicon wafer 110 is etched. It is appreciated that the patterned mask defines actuator features. MEMS features corresponding to the device silicon wafer 110 and/or the rough polysilicon layer 122 that is not covered by the patterned mask layer is etched (e.g., using DRIE). In other words, the exposed portions of the rough polysilicon layer 112 and/or the device silicon wafer 110 is etched to form the MEMS feature.

It is appreciated that the patterned etch stop layer 113 serves as an etch stop layer due to high selectivity with respect to silicon during this etch process to form the features. In other words, during the etch process, the device silicon wafer 110 and/or rough polysilicon layer 122 (if used) are etched until the patterned etch stop layer 113 is reached and exposed. The polysilicon layer 116 acts as tether for the features being etched and formed when silicon is completely removed from the features. The combination of the polysilicon layer 116 and the patterned etch stop layer 113 reduces tilting of proof mass and sidewall damage in the patterned features during the etch process. Moreover, the polysilicon layer 116 enhances structural robustness of the patterned etch stop layer 113 and prevents the etch stop layer 113 from cracking or breaking during the actuator etch process.

Figure 15A:
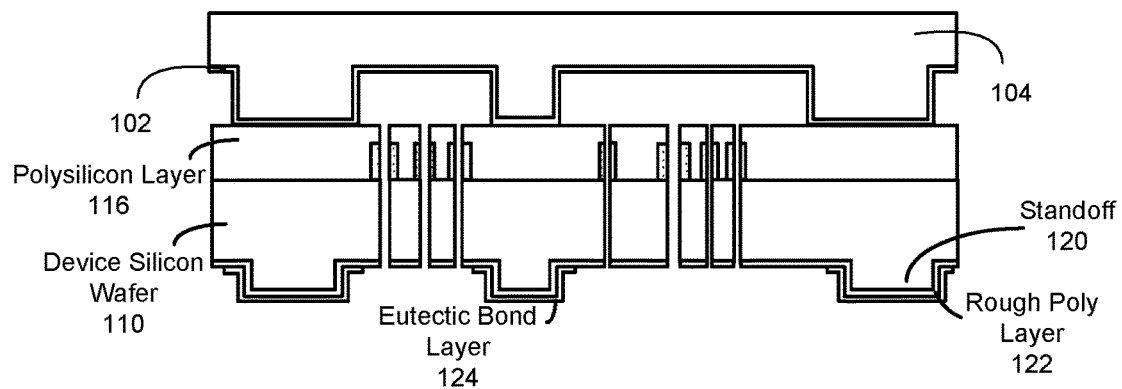
FIG. 15A shows the MEMS wafer after removing the etch stop layer and the polysilicon layer according to one aspect of the present embodiments.

FIG. 15A shows the MEMS wafer after removing the etch stop layer and the polysilicon layer according to one aspect of the present embodiments. The patterned etch stop layer 113 that has been exposed (corresponding to the actuator features) is removed using RIE or DRIE process. Once the etch stop layer 113 is removed, the polysilicon layer 116 is exposed and is subsequently removed, thus exposing the interior of the cavity. As such, the actuator features is released within a short period from one another, thereby reducing any tilting/bending, etc., and as a result improving device performance.

Figure 15B:
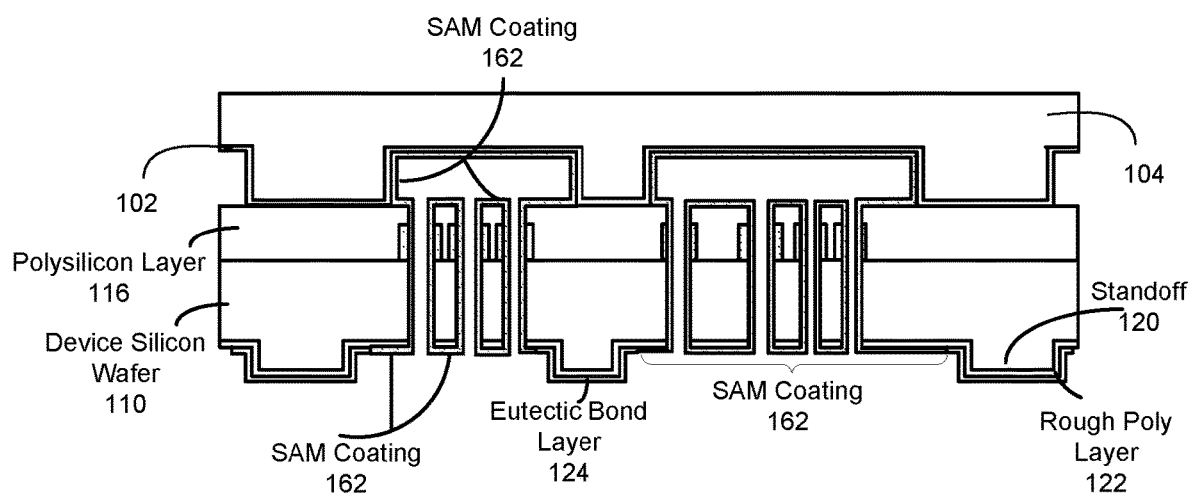
FIG. 15B shows the MEMS wafer after forming a self-assembled monolayer (SAM) coating according to one aspect of the present embodiments.

FIG. 15B shows the MEMS wafer after forming a self-assembled monolayer (SAM) coating according to one aspect of the present embodiments. In some embodiments, the formed actuator features and interior surface of the cavity may be treated with a thin oxide (i.e. oxidation) to improve a SAM coating 162 to follow in order to improve stiction. SAM coating 162 is an anti-stiction layer and may include FDTS. The SAM coating 162 may be thermally and chemically treated. SAM coating 162 may cover the interior surface of the cavity as well as around the actuator features, thereby improving stiction. It is appreciated that the MEMS wafer may be eutecticly bonded to a CMOS (not shown).

Figure 16A:
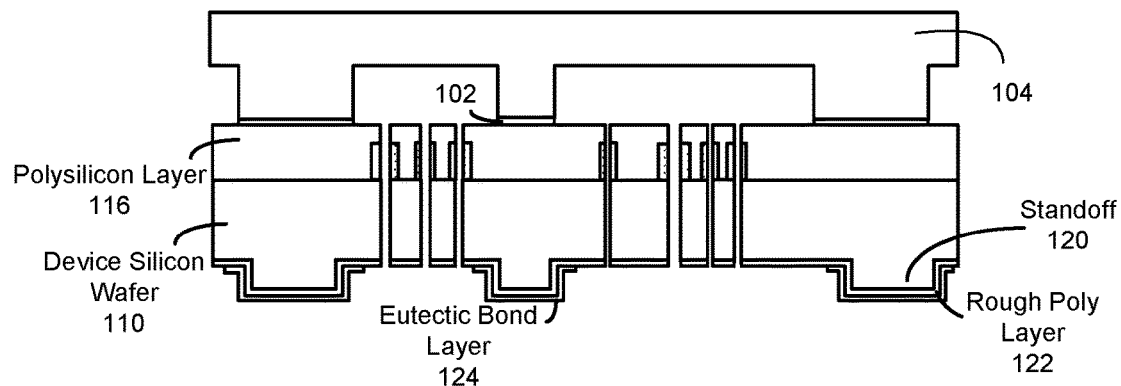
FIG. 16A shows a MEMS wafer after removing the fusion bond layer from the cavity according to one aspect of the present embodiments.

FIG. 16A shows a MEMS wafer of FIG. 15A after removing the fusion bond layer from the cavity according to one aspect of the present embodiments. In this embodiments, the fusion bond 102 layer covering the interior surface of the cavity is removed, e.g., by etching using a vapor hydrofluoric (VHF) acid. As such, charging that may result from the fusion bond layer 102 (e.g., from oxide) is eliminated and therefore it improves device reliability and its stiction performance.

Figure 16B:
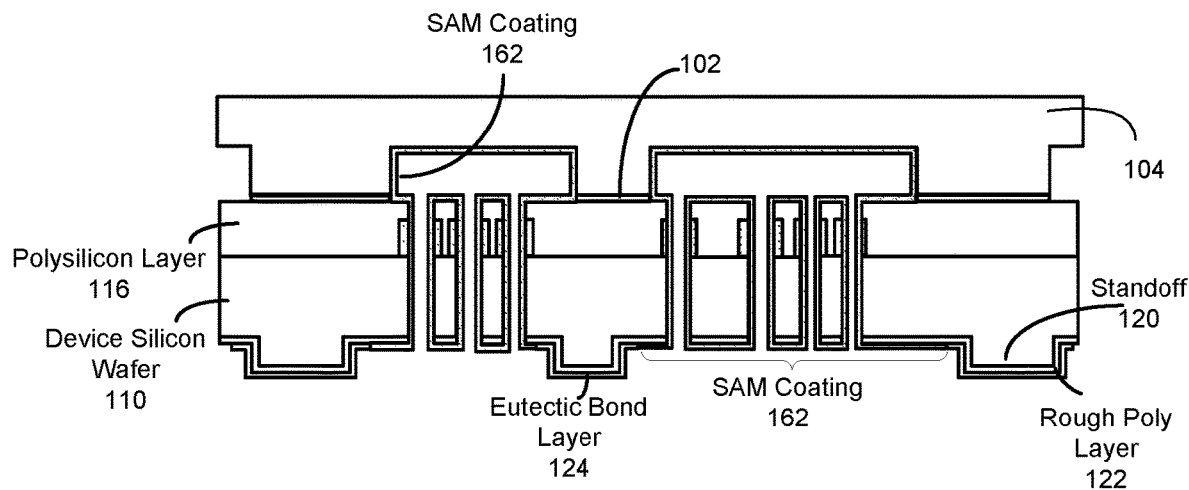
FIG. 16B shows a MEMS wafer after forming a SAM coating after the fusion bond layer is removed according to one aspect of the present embodiments.

FIG. 16B shows a MEMS wafer of FIG. 16A after forming a SAM coating after the fusion bond layer is removed according to one aspect of the present embodiments. The formed actuator features and interior surface of the cavity (without the fusion bond layer 102) may be treated with a thin oxide (i.e. oxidation) to improve a SAM coating 162 to follow in order to improve stiction. SAM coating 162 is an anti-stiction layer and may include FDTS. The SAM coating 162 may be thermally and chemically treated. SAM coating 162 may cover the interior surface of the cavity as well as around the actuator features, thereby improving stiction. It is appreciated that the MEMS wafer may be eutecticly bonded to a CMOS (not shown).

Figure 17:
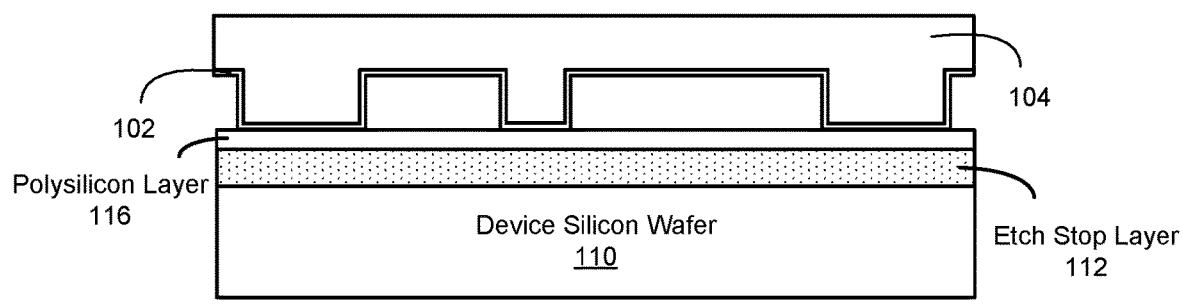
FIG. 17 shows the MEMS wafer after fusion bonding a handle wafer to a MEMS wafer with unpatterned etch stop layer according to one aspect of the present embodiments.

FIG. 17 shows the MEMS wafer after fusion bonding a handle wafer to a MEMS wafer with unpatterned etch stop layer according to one aspect of the present embodiments. FIG. 17 is the same as FIG. 6 except that the etch stop layer 112 is not patterned and covers the first side of the device silicon wafer 110.

Figure 18:
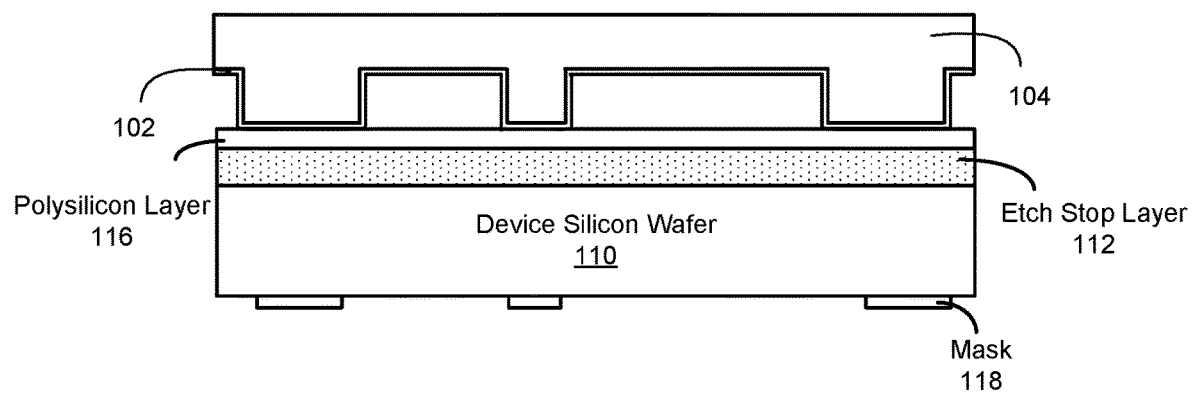
FIG. 18 shows the MEMS wafer of FIG. 17 after formation of a mask corresponding to a standoff according to one aspect of the present embodiments.

FIG. 18 shows the MEMS wafer of FIG. 17 after formation of a mask corresponding to a standoff according to one aspect of the present embodiments. In some embodiments, mask 118 may be deposited on the second side of the device silicon wafer 110 and patterned to correspond to location of the standoff. In this embodiment, three standoffs are being formed. However, the number of standoffs is merely for illustrative purposes and should not be construed as limiting the scope of the embodiments.

Figure 19:
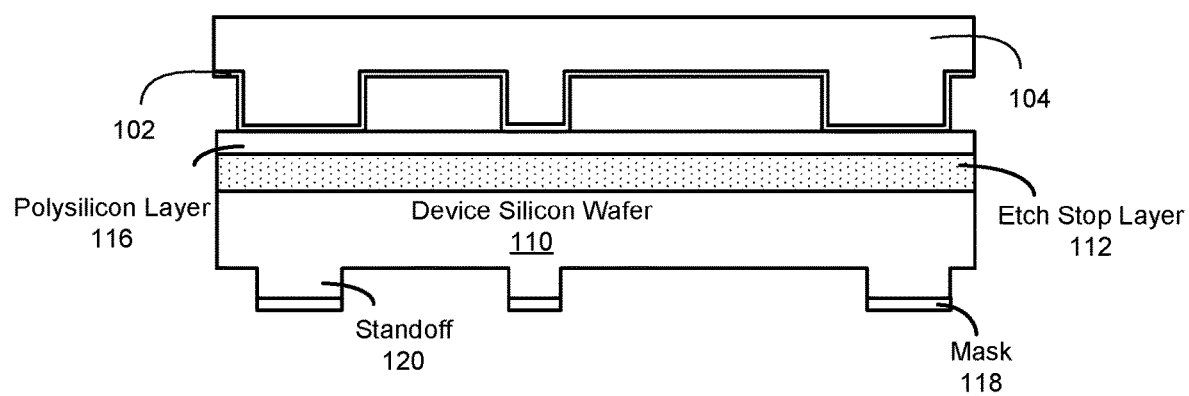
FIG. 19 shows the MEMS wafer of FIG. 18 after forming a standoff according to one aspect of the present embodiments.

FIG. 19 shows the MEMS wafer of FIG. 18 after forming a standoff according to one aspect of the present embodiments. Once mask 118 is formed that corresponds to location of standoffs, the second side of the device silicon wafer 110 is etched, thereby forming the standoffs 120.

Figure 20:
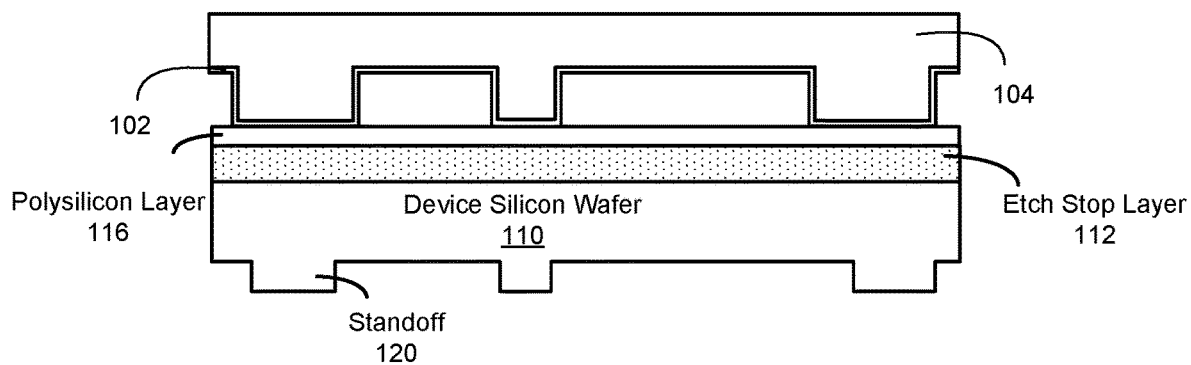
FIG. 20 shows the MEMS wafer of FIG. 19 after removing the mask once a standoff is formed according to one aspect of the present embodiments.

FIG. 20 shows the MEMS wafer of FIG. 19 after removing the mask once a standoff is formed according to one aspect of the present embodiments. Once the standoffs 120 are formed, the mask 118 may be removed.

Figure 21:
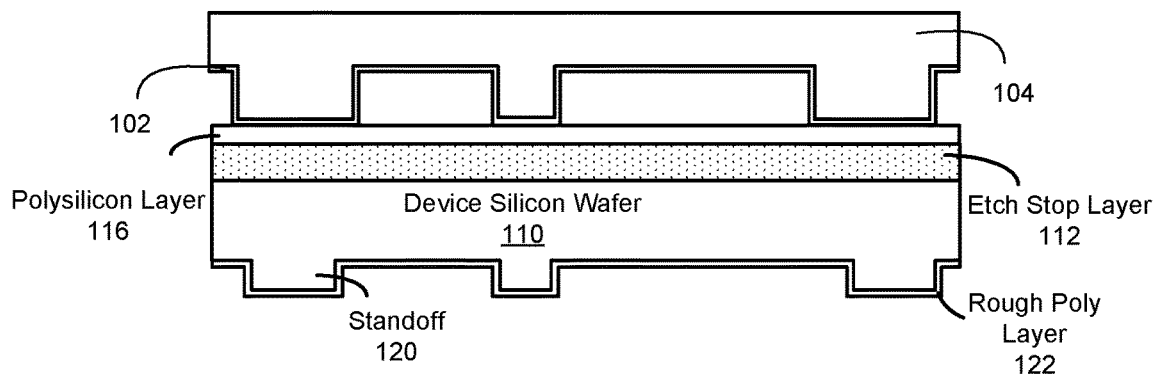
FIG. 21 shows the MEMS wafer of FIG. 19 after deposition of rough polysilicon to improve stiction according to one aspect of the present embodiments.

FIG. 21 shows the MEMS wafer of FIG. 19 after deposition of rough polysilicon to improve stiction according to one aspect of the present embodiments. In some embodiments, a rough polysilicon layer 122 is deposited on the second side of the device silicon wafer 110. In some embodiments, the rough polysilicon layer 122 is deposited directly on the second side of the device silicon wafer 110. It is appreciated that the rough polysilicon layer 122 is optional and it improves stiction. In other embodiments, the rough polysilicon layer 122 may be absent. It is appreciated that the rough polysilicon layer 122 may be substituted with a different material in order to improve stiction.

Figure 22:
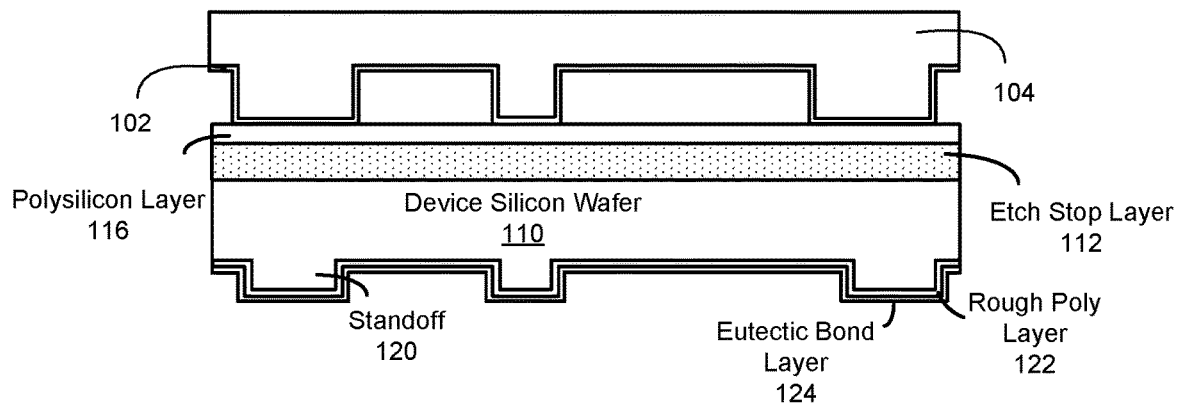
FIG. 22 shows the MEMS wafer of FIG. 21 after forming a eutectic bond layer according to one aspect of the present embodiments.

FIG. 22 shows the MEMS wafer of FIG. 21 after forming a eutectic bond layer according to one aspect of the present embodiments. A eutectic bond layer 124, e.g., Germanium, Aluminum, etc., may be deposited the rough polysilicon layer 122. It is appreciated that since use of the rough polysilicon layer 122 is optional in embodiments where no rough polysilicon layer 122 is used the eutectic bond layer 124 is deposited directly on the second side of the device silicon wafer 110. In some embodiments, the eutectic bond layer 124 is formed through a sputtering process.

Figure 23:
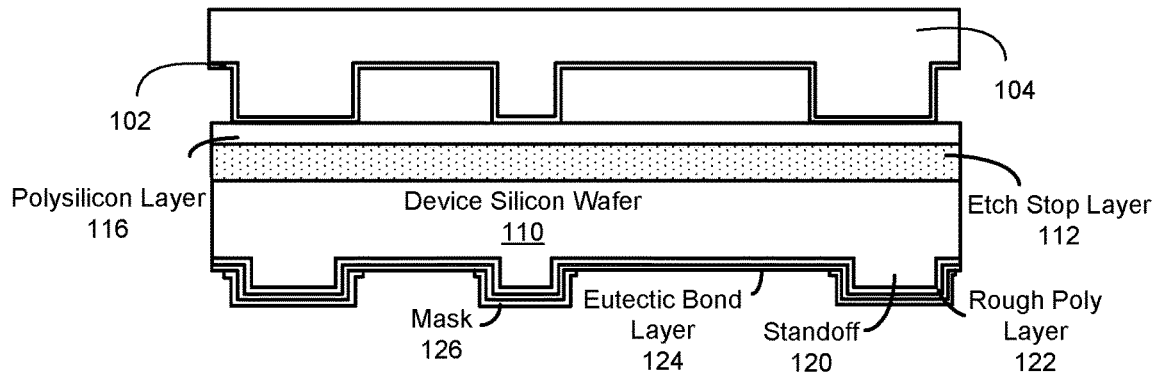
FIG. 23 shows the MEMS wafer of FIG. 22 after forming a mask on the eutectic bond layer of a standoff according to one aspect of the present embodiments.

FIG. 23 shows the MEMS wafer of FIG. 22 after forming a mask on the eutectic bond layer of a standoff according to one aspect of the present embodiments. In this embodiment, the mask 126 (may be a photoresist) is deposited/patterned to cover a portion of the eutectic bond layer 124 that corresponds to the standoff. The mask 126 protects the eutectic bond layer 124 that lies underneath that covers the standoffs 120. Accordingly, the quality of the eutectic bond layer is not compromised for later eutectic bonding to a CMOS at a later stage. It is appreciated that in some embodiments, the mask 126 may be formed over the eutectic bond layer 124 and subsequently patterned to maintain the mask 126 that cover the standoffs 120 while other portions are removed exposing the eutectic bond layer 124 that does not cover the standoffs 120.

Figure 24:
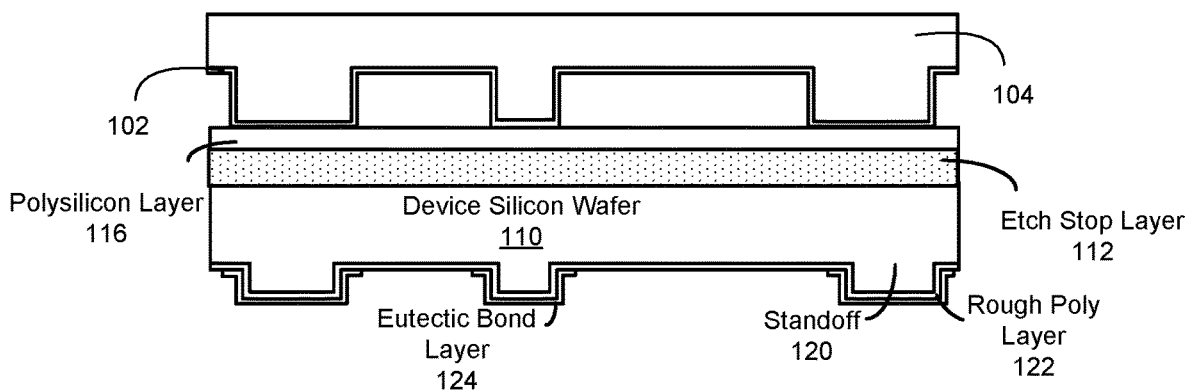
FIG. 24 shows the MEMS wafer of FIG. 23 after etching the exposed eutectic bond layer and after removal of the mask that protected the standoff according to one aspect of the present embodiments.

FIG. 24 shows the MEMS wafer of FIG. 23 after etching the exposed eutectic bond layer and after removal of the mask that protected the standoff according to one aspect of the present embodiments. The exposed portion of the eutectic bond layer 124 (i.e. portions that are not covered by the mask 126) are removed (i.e. etched) exposing the rough polysilicon layer 122 underneath. It is appreciated that in the embodiments that the rough polysilicon layer 122 is not used, once the eutectic bond layer 124 that is exposed is removed the surface of the second side of the device silicon wafer 110 is exposed. Once the exposed portion of the eutectic bond layer 124 is removed, the mask 126 may be removed that expose the eutectic bond layer 124 covering the standoffs 120.

Figure 25:
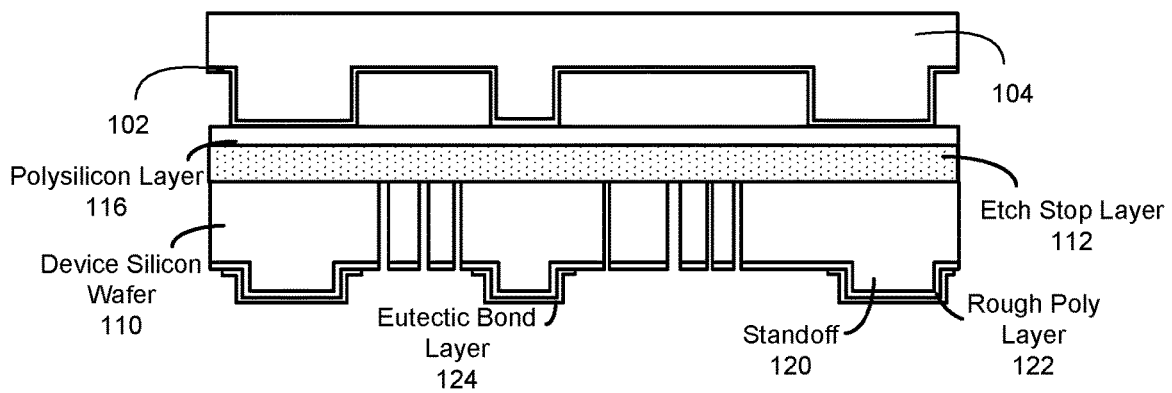
FIG. 25 shows the MEMS wafer of FIG. 24 after etching MEMS features to expose the etch stop layer according to one aspect of the present embodiments.

FIG. 25 shows the MEMS wafer of FIG. 24 after etching MEMS features to expose the etch stop layer according to one aspect of the present embodiments. The MEMS features (i.e. actuator features) are etched. In some embodiments, a mask (not shown) is applied on the second side of the device silicon wafer 110, patterned and the exposed portions of the rough polysilicon layer 122 and/or the second side of the device silicon wafer 110 is etched. It is appreciated that the patterned mask defines actuator features. MEMS features corresponding to the device silicon wafer 110 and/or the rough polysilicon layer 122 that is not covered by the patterned mask layer is etched (e.g., using DRIE). In other words, the exposed portions of the rough polysilicon layer 112 and/or the device silicon wafer 110 is etched to form the MEMS features.

It is appreciated that the etch stop layer 112 serves as an etch stop layer due to high selectivity with respect to silicon during this etch process to form the features. In other words, during the etch process, the device silicon wafer 110 and/or rough polysilicon layer 122 (if used) are etched until the etch stop layer 112 is reached and exposed. The polysilicon layer 116 acts as tether for the features being etched and formed when silicon is completely removed from the features. The combination of the polysilicon layer 116 and the etch stop layer 112 reduces tilting of proof mass and sidewall damage in the patterned features during the etch process. Moreover, the polysilicon layer 116 enhances structural robustness of the etch stop layer 112 and prevents the etch stop layer 112 from cracking or breaking during the actuator etch process.

Figure 26A:
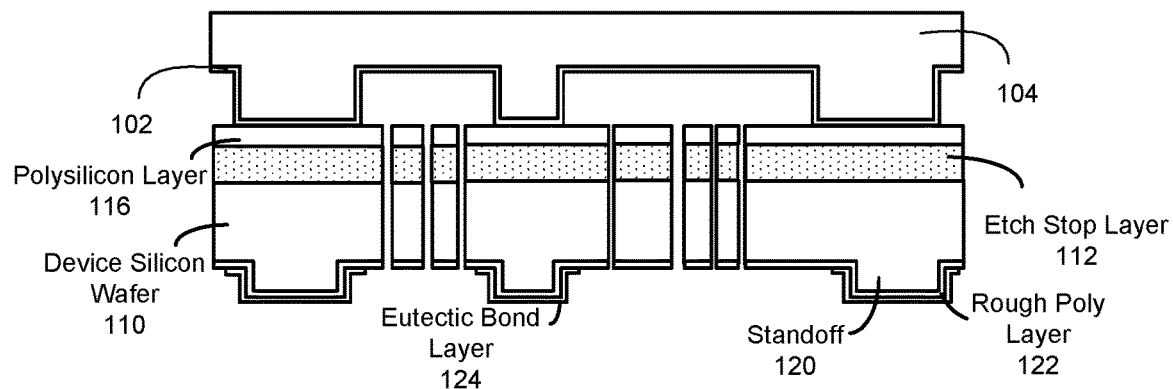
FIG. 26A shows the MEMS wafer of FIG. 25 after removing the etch stop layer and the polysilicon layer according to one aspect of the present embodiments.

FIG. 26A shows the MEMS wafer of FIG. 25 after removing the etch stop layer and the polysilicon layer according to one aspect of the present embodiments. The etch stop layer 112 that has been exposed (corresponding to the actuator features) is removed using ME or DRIE process. Once the etch stop layer 112 is removed, the polysilicon layer 116 is exposed and is subsequently removed, thus exposing the interior of the cavity. As such, the actuator features are released within a short period from one another, thereby reducing any tilting/bending, etc., and as a result improving device performance.

Figure 26B:
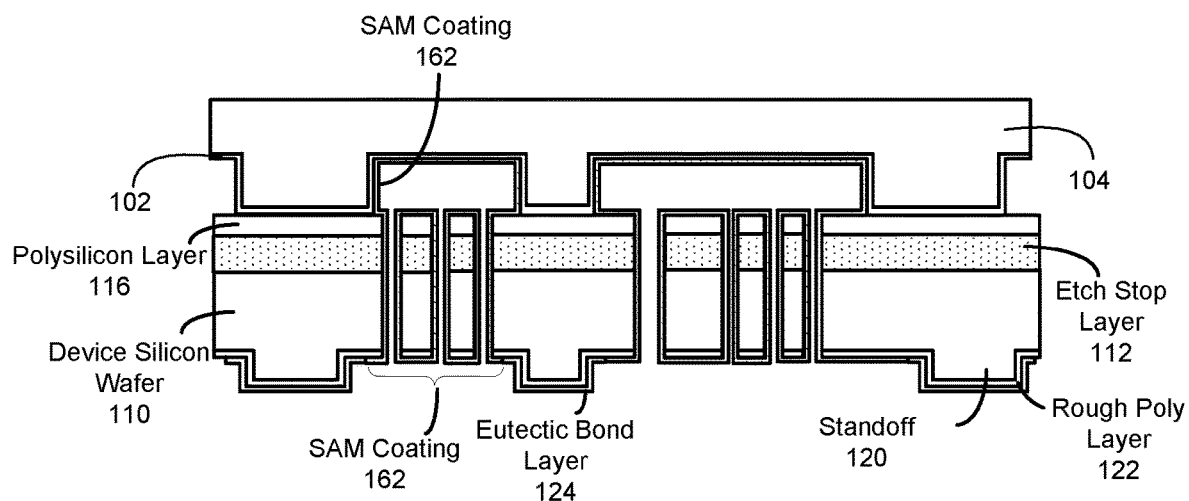
FIG. 26B shows the MEMS wafer of FIG. 26A after forming a SAM coating according to one aspect of the present embodiments.

FIG. 26B shows the MEMS wafer of FIG. 26A after forming a SAM coating according to one aspect of the present embodiments. In some embodiments, the formed actuator features and interior surface of the cavity may be treated with a thin oxide (i.e. oxidation) to improve a SAM coating 162 to follow in order to improve stiction. SAM coating 162 is an anti-stiction layer and may include FDTS. The SAM coating 162 may be thermally and chemically treated. SAM coating 162 may cover the interior surface of the cavity as well as around the actuator features, thereby improving stiction. It is appreciated that the MEMS wafer may be euteticly bonded to a CMOS (not shown).

Figure 27A:
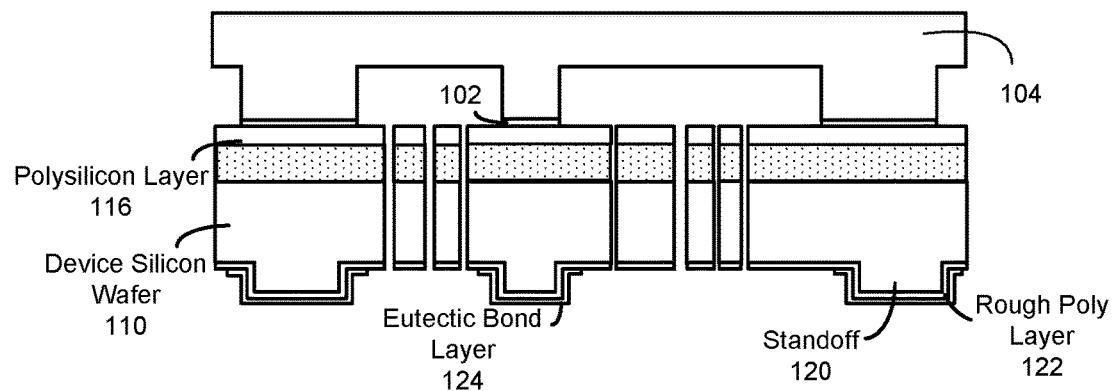
FIG. 27A shows a MEMS wafer of FIG. 26A after removing the fusion bond layer from the cavity according to one aspect of the present embodiments.

FIG. 27A shows a MEMS wafer of FIG. 26A after removing the fusion bond layer from the cavity according to one aspect of the present embodiments. In this embodiments, the fusion bond 102 layer covering the interior surface of the cavity is removed, e.g., by etching using a vapor hydrofluoric (VHF) acid. As such, charging that may result from the fusion bond layer 102 (e.g., from oxide) is eliminated and therefore it improves device reliability and its stiction performance.

Figure 27B:
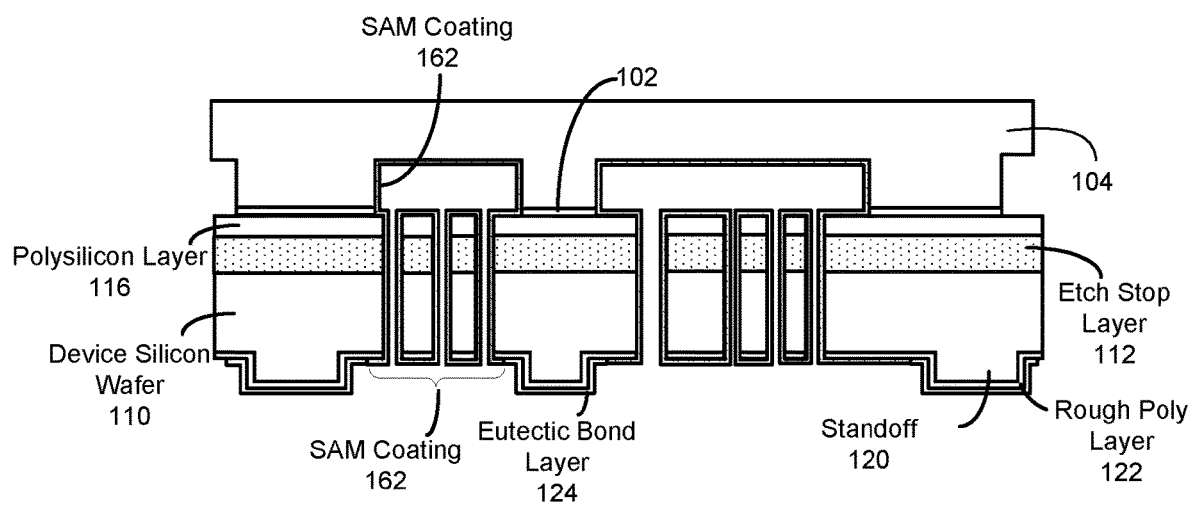
FIG. 27B shows a MEMS wafer after forming a SAM coating after the fusion bond layer is removed according to one aspect of the present embodiments.

FIG. 27B shows a MEMS wafer after forming a SAM coating after the fusion bond layer is removed according to one aspect of the present embodiments. The formed actuator features and interior surface of the cavity (without the fusion bond layer 102) may be treated with a thin oxide (i.e. oxidation) to improve a SAM coating 162 to follow in order to improve stiction. SAM coating 162 is an anti-stiction layer and may include FDTS. The SAM coating 162 may be thermally and chemically treated. SAM coating 162 may cover the interior surface of the cavity as well as around the actuator features, thereby improving stiction. It is appreciated that the MEMS wafer may be euteticly bonded to a CMOS (not shown).

Figure 28:
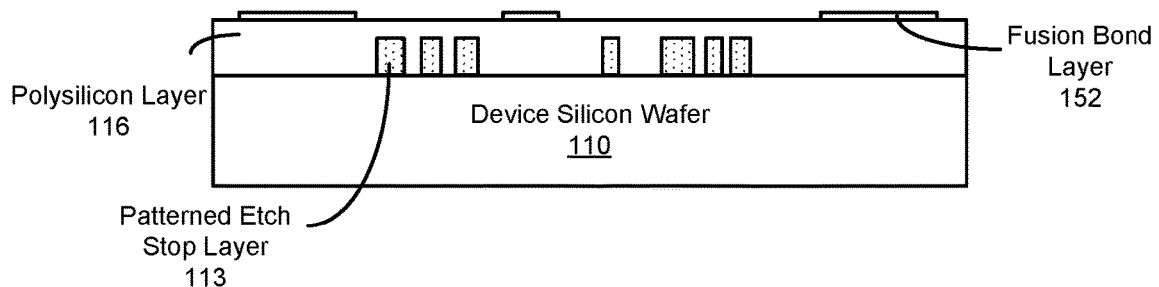
FIG. 28 shows a MEMS wafer of FIG. 5 after forming a fusion bond layer on the MEMS wafer according to one aspect of the present embodiments.

FIG. 28 shows a MEMS wafer of FIG. 5 after forming a fusion bond layer on the MEMS wafer according to one aspect of the present embodiments. It is appreciated that the embodiments described in FIGS. 28-38B are equally applicable to an unpatterned etch stop layer, as described in FIGS. 17-27B. In some embodiments, a polysilicon layer 116 is formed over the patterned etch stop layer 113 (i.e. covering the patterned etch stop layer 113) and it is further formed over the exposed surface portion of the device silicon wafer 110. It is appreciated that the polysilicon layer 116 provides mechanical support for the patterned etch stop layer 113 during the etch process that forms the actuator features and prevents the patterned etch stop layer 113 from cracking or breaking during the etch process. It is appreciated that the polysilicon layer 116 may also be used as bonding material for fusion bonding the device silicon wafer 110 to the handle silicon wafer (described later). In some embodiments, the polysilicon layer 116 may be polished to prepare a flat polysilicon surface for fusion bonding with the handle silicon wafer that is described later. In this embodiments, instead of the handle silicon wafer 104 being coated with fusion bond oxide 102, the fusion bond layer 152 is deposited on the polysilicon layer 116 and bonded thereto.

Figure 29:
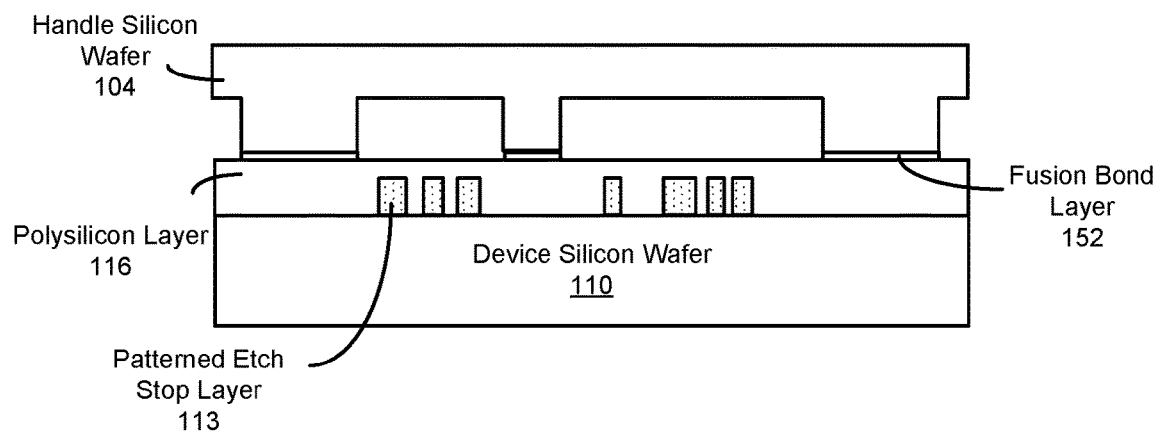
FIG. 29 shows the MEMS wafer of FIG. 28 after fusion bonding a handle wafer to a MEMS wafer with patterned etch stop layer according to one aspect of the present embodiments.

FIG. 29 shows the MEMS wafer of FIG. 28 after fusion bonding a handle wafer to a MEMS wafer with patterned etch stop layer according to one aspect of the present embodiments. In some embodiments, the handle silicon wafer 104 is fusion bonded to the device silicon wafer 110 via the fusion bond layer 152 that is deposited on the polysilicon layer 116. As described above, one or more cavities may be formed.

Figure 30:
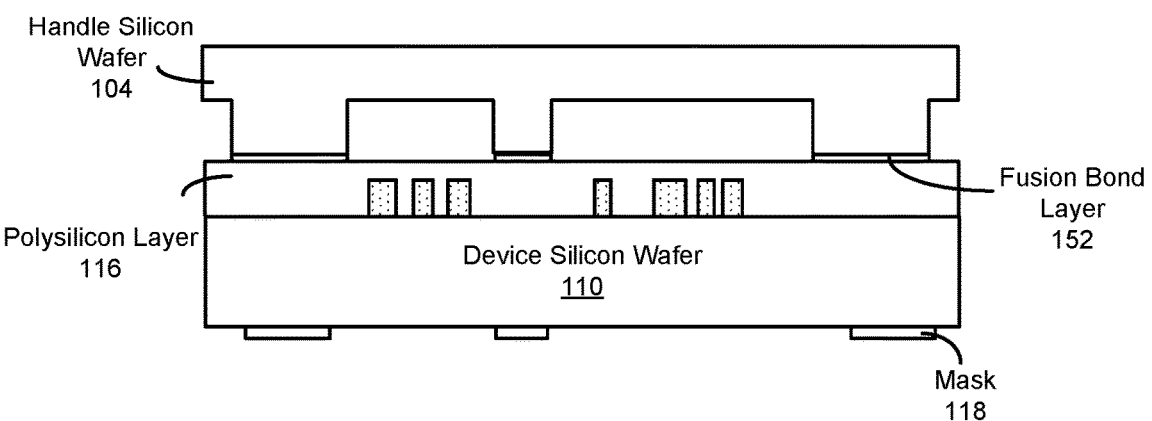
FIG. 30 shows the MEMS wafer of FIG. 29 after formation of a mask corresponding to a standoff according to one aspect of the present embodiments.

FIG. 30 shows the MEMS wafer of FIG. 29 after formation of a mask corresponding to a standoff according to one aspect of the present embodiments. In some embodiments, mask 118 may be deposited on the second side of the device silicon wafer 110 and patterned to correspond to location of the standoff. In this embodiment, three standoffs are being formed. However, the number of standoffs is merely for illustrative purposes and should not be construed as limiting the scope of the embodiments.

Figure 31:
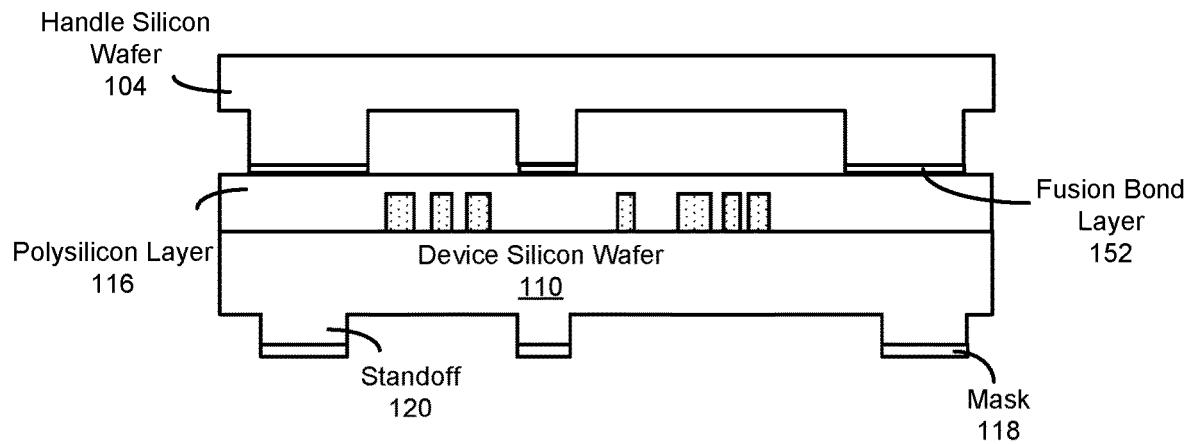
FIG. 31 shows the MEMS wafer of FIG. 30 after forming a standoff according to one aspect of the present embodiments.

FIG. 31 shows the MEMS wafer of FIG. 30 after forming a standoff according to one aspect of the present embodiments. Once mask 118 is formed that corresponds to location of standoffs, the second side of the device silicon wafer 110 is etched, thereby forming the standoffs 120.

Figure 32:
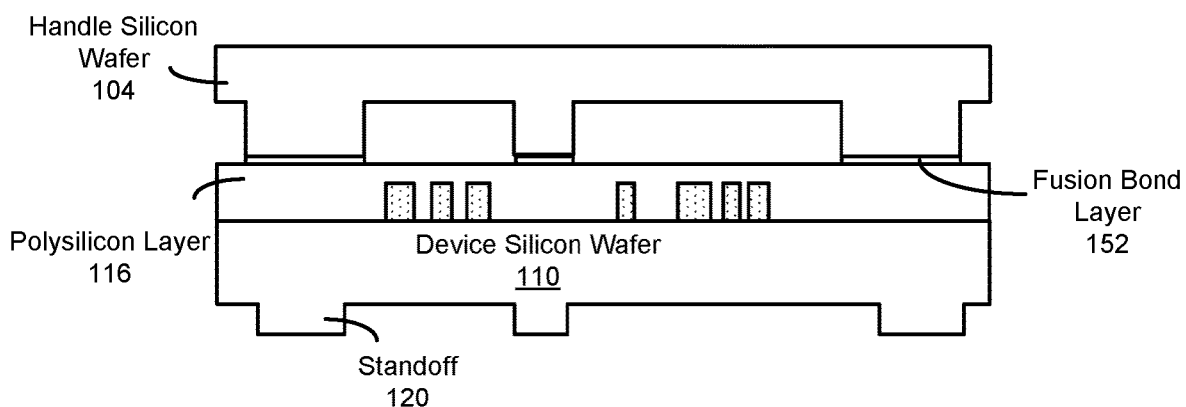
FIG. 32 shows the MEMS wafer of FIG. 31 after removing the mask once a standoff is formed according to one aspect of the present embodiments.

FIG. 32 shows the MEMS wafer of FIG. 31 after removing the mask once a standoff is formed according to one aspect of the present embodiments. Once the standoffs 120 are formed, the mask 118 may be removed.

Figure 33:
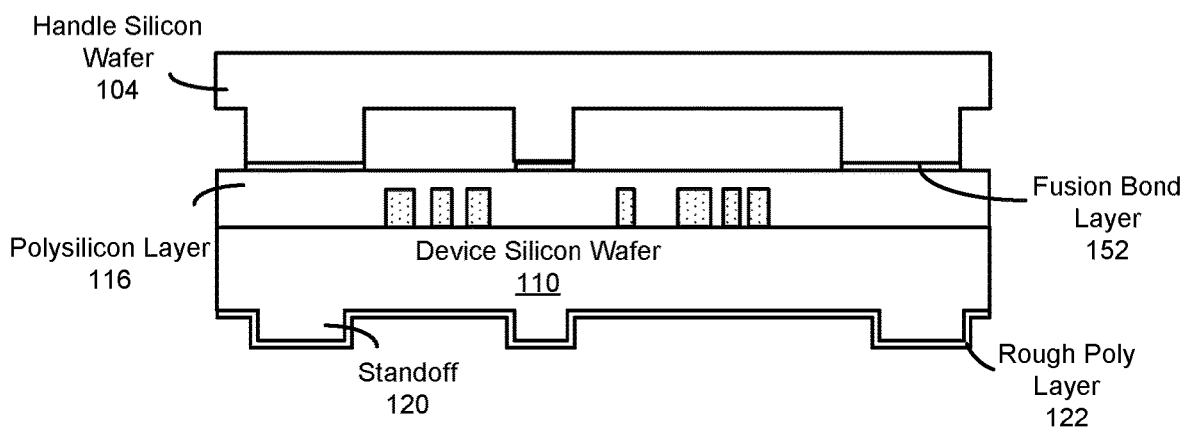
FIG. 33 shows the MEMS wafer of FIG. 32 after deposition of rough polysilicon to improve stiction according to one aspect of the present embodiments.

FIG. 33 shows the MEMS wafer of FIG. 32 after deposition of rough polysilicon to improve stiction according to one aspect of the present embodiments. In some embodiments, a rough polysilicon layer 122 is deposited on the second side of the device silicon wafer 110. In some embodiments, the rough polysilicon layer 122 is deposited directly on the second side of the device silicon wafer 110. It is appreciated that the rough polysilicon layer 122 is optional and it improves stiction. In other embodiments, the rough polysilicon layer 122 may be absent. It is appreciated that the rough polysilicon layer 122 may be substituted with a different material in order to improve stiction.

Figure 34:
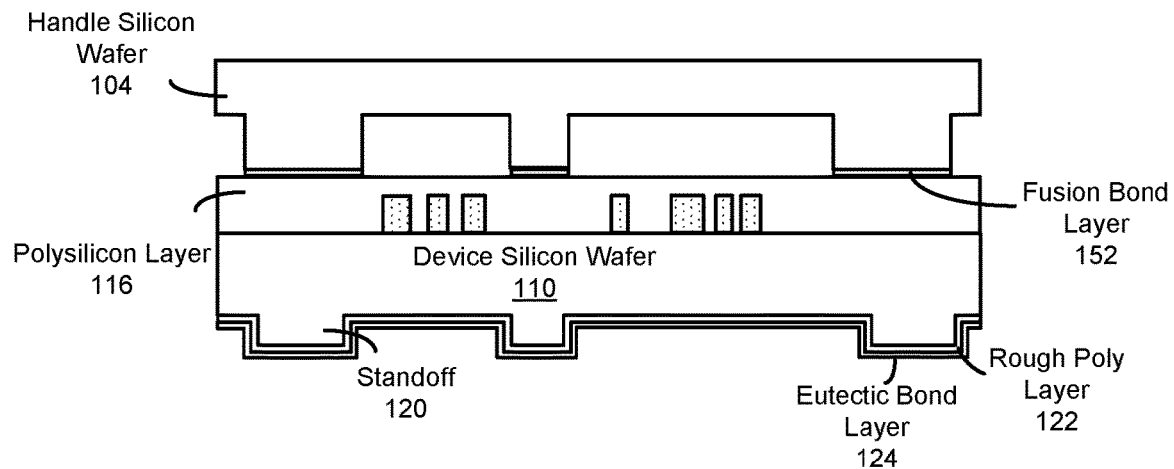
FIG. 34 shows the MEMS wafer of FIG. 33 after forming a eutectic bond layer according to one aspect of the present embodiments.

FIG. 34 shows the MEMS wafer of FIG. 33 after forming a eutectic bond layer according to one aspect of the present embodiments. A eutectic bond layer 124, e.g., Germanium, Aluminum, etc., may be deposited the rough polysilicon layer 122. It is appreciated that since use of the rough polysilicon layer 122 is optional in embodiments where no rough polysilicon layer 122 is used the eutectic bond layer 124 is deposited directly on the second side of the device silicon wafer 110. In some embodiments, the eutectic bond layer 124 is formed through a sputtering process.

Figure 35:
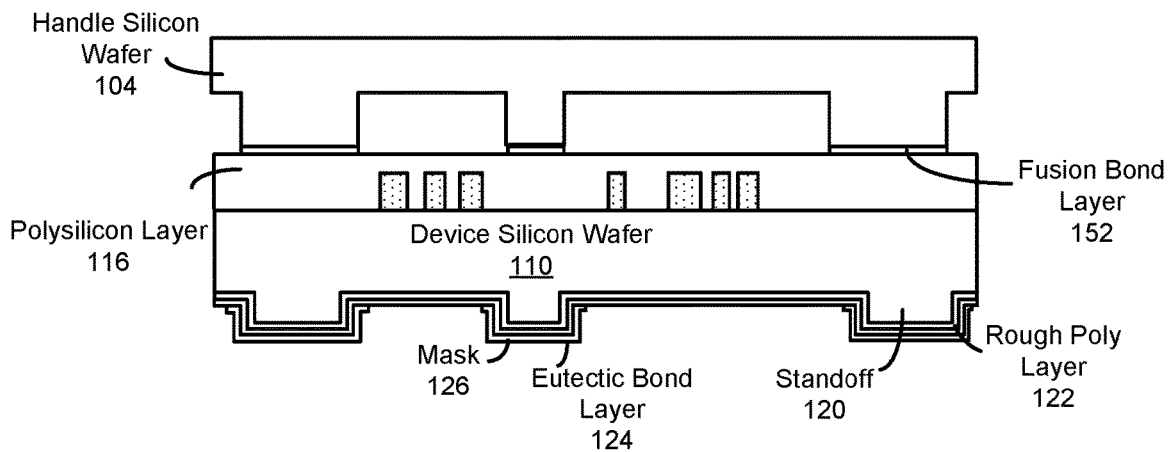
FIG. 35 shows the MEMS wafer of FIG. 34 after forming a mask on the eutectic bond layer of a standoff according to one aspect of the present embodiments.

FIG. 35 shows the MEMS wafer of FIG. 34 after forming a mask on the eutectic bond layer of a standoff according to one aspect of the present embodiments. In this embodiment, the mask 126 (may be a photoresist) is deposited/patterned to cover a portion of the eutectic bond layer 124 that corresponds to the standoff. The mask 126 protects the eutectic bond layer 124 that lies underneath that covers the standoffs 120. Accordingly, the quality of the eutectic bond layer is not compromised for later eutectic bonding to a CMOS at a later stage. It is appreciated that in some embodiments, the mask 126 may be formed over the eutectic bond layer 124 and subsequently patterned to maintain the mask 126 that cover the standoffs 120 while other portions are removed exposing the eutectic bond layer 124 that does not cover the standoffs 120.

Figure 36:
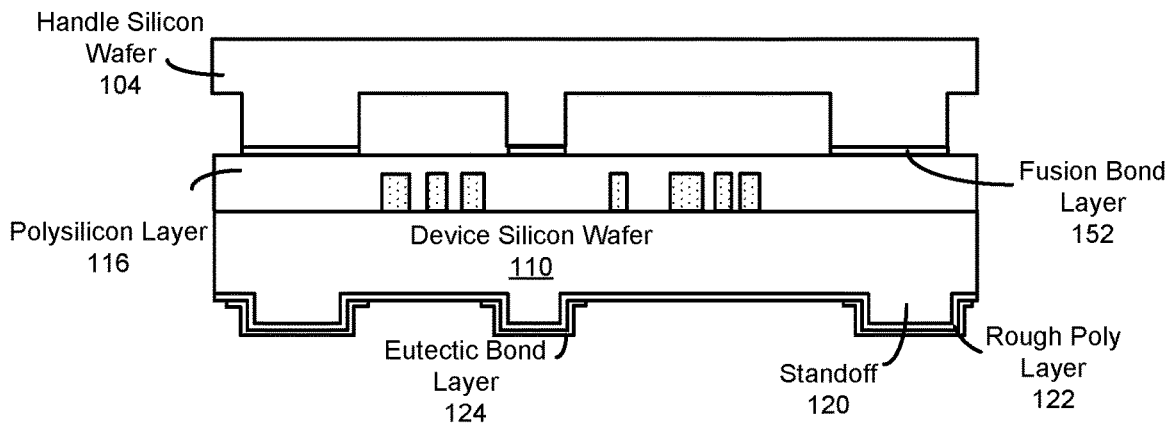
FIG. 36 shows the MEMS wafer of FIG. 35 after etching the exposed eutectic bond layer and after removal of the mask that protected the standoff according to one aspect of the present embodiments.

FIG. 36 shows the MEMS wafer of FIG. 35 after etching the exposed eutectic bond layer and after removal of the mask that protected the standoff according to one aspect of the present embodiments. The exposed portion of the eutectic bond layer 124 (i.e. portions that are not covered by the mask 126) are removed (i.e. etched) exposing the rough polysilicon layer 122 underneath. It is appreciated that in the embodiments that the rough polysilicon layer 122 is not used, once the eutectic bond layer 124 that is exposed is removed the surface of the second side of the device silicon wafer 110 is exposed. Once the exposed portion of the eutectic bond layer 124 is removed, the mask 126 may be removed that expose the eutectic bond layer 124 covering the standoffs 120.

Figure 37:
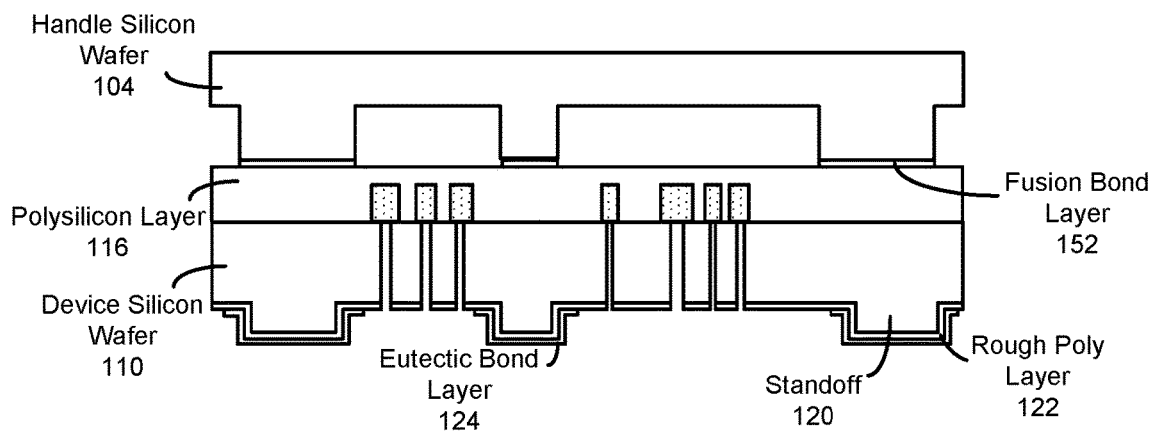
FIG. 37 shows the MEMS wafer of FIG. 36 after etching MEMS features to expose the etch stop layer according to one aspect of the present embodiments.

FIG. 37 shows the MEMS wafer of FIG. 36 after etching MEMS features to expose the etch stop layer according to one aspect of the present embodiments. The MEMS features (i.e. actuator features) are etched. In some embodiments, a mask (not shown) is applied on the second side of the device silicon wafer 110, patterned and the exposed portions of the rough polysilicon layer 122 and/or the second side of the device silicon wafer 110 is etched. It is appreciated that the patterned mask defines actuator features. MEMS features corresponding to the device silicon wafer 110 and/or the rough polysilicon layer 122 that is not covered by the patterned mask layer is etched (e.g., using DRIE). In other words, the exposed portions of the rough polysilicon layer 112 and/or the device silicon wafer 110 is etched to form the MEMS features.

It is appreciated that the unpatterned etch stop layer 112 serves as an etch stop layer due to high selectivity with respect to silicon during this etch process to form the features. In other words, during the etch process, the device silicon wafer 110 and/or rough polysilicon layer 122 (if used) are etched until the unpatterned etch stop layer 112 is reached and exposed. The polysilicon layer 116 acts as tether for the features being etched and formed when silicon is completely removed from the features. The combination of the polysilicon layer 116 and the unpatterned etch stop layer 112 reduces tilting of proof mass and sidewall damage in the patterned features during the etch process. Moreover, the polysilicon layer 116 enhances structural robustness of the patterned etch stop layer 113 and prevents the unpatterned etch stop layer 112 from cracking or breaking during the actuator etch process.

Figure 38A:
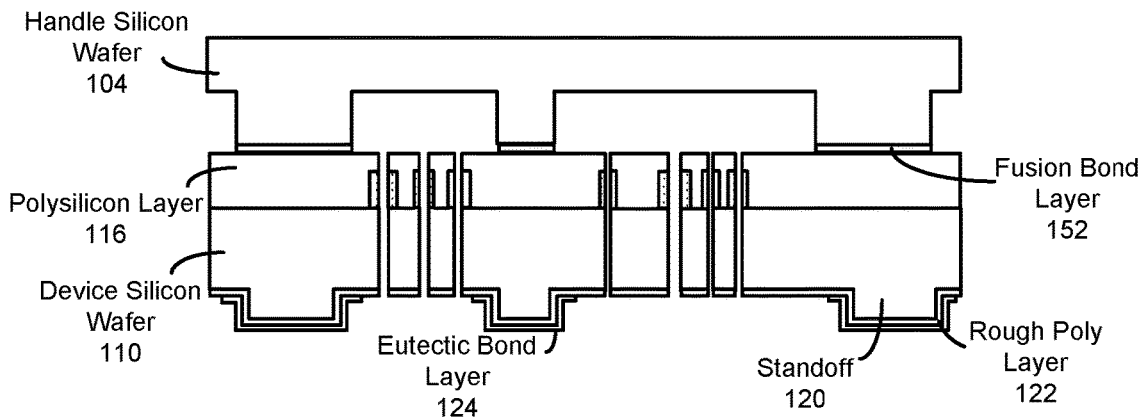
FIG. 38A shows the MEMS wafer of FIG. 37 after removing the etch stop layer and the polysilicon layer according to one aspect of the present embodiments.

FIG. 38A shows the MEMS wafer of FIG. 37 after removing the etch stop layer and the polysilicon layer according to one aspect of the present embodiments. The unpatterned etch stop layer 112 that has been exposed (corresponding to the actuator features) is removed using RIE or DRIE process. Once the unpatterned etch stop layer 112 is removed, the polysilicon layer 116 is exposed and is subsequently removed, thus exposing the interior of the cavity. As such, the actuator features are released within a short period from one another, thereby reducing any tilting/bending, etc., and as a result reducing parametric degradation or device failures.

Figure 38B:
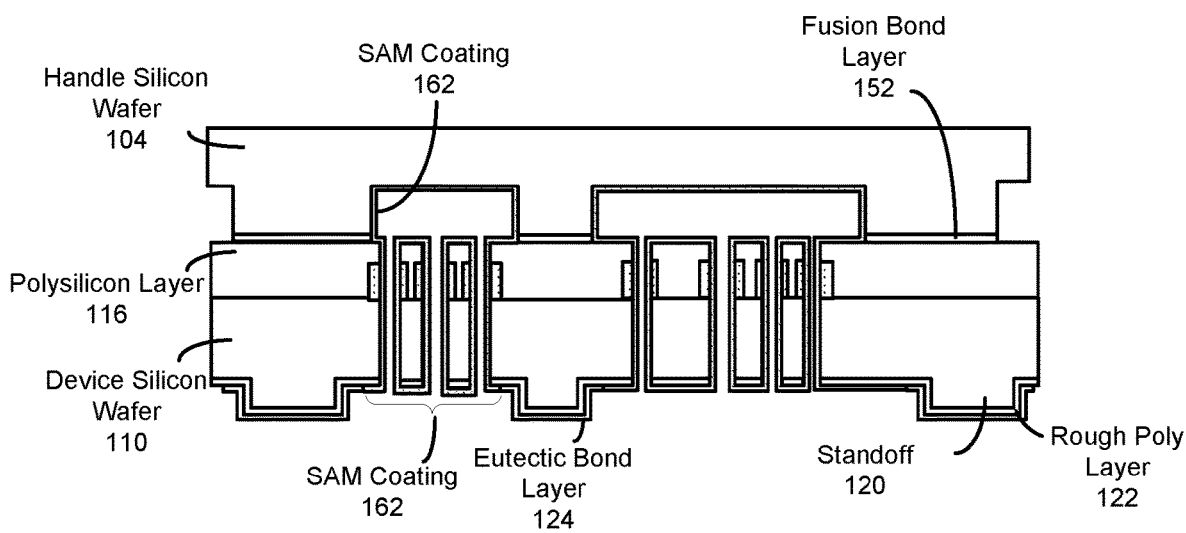
FIG. 38B shows the MEMS wafer of FIG. 38A after forming a SAM coating according to one aspect of the present embodiments.

FIG. 38B shows the MEMS wafer of FIG. 38A after forming a SAM coating according to one aspect of the present embodiments. In some embodiments, the formed actuator features and interior surface of the cavity may be treated with a thin oxide (i.e. oxidation) to improve a SAM coating 162 to follow in order to improve stiction. SAM coating 162 is an anti-stiction layer and may include FDTS. The SAM coating 162 may be thermally and chemically treated. SAM coating 162 may cover the interior surface of the cavity as well as around the actuator features, thereby improving stiction. It is appreciated that the MEMS wafer may be eutecticly bonded to a CMOS (not shown).

Figure 39:
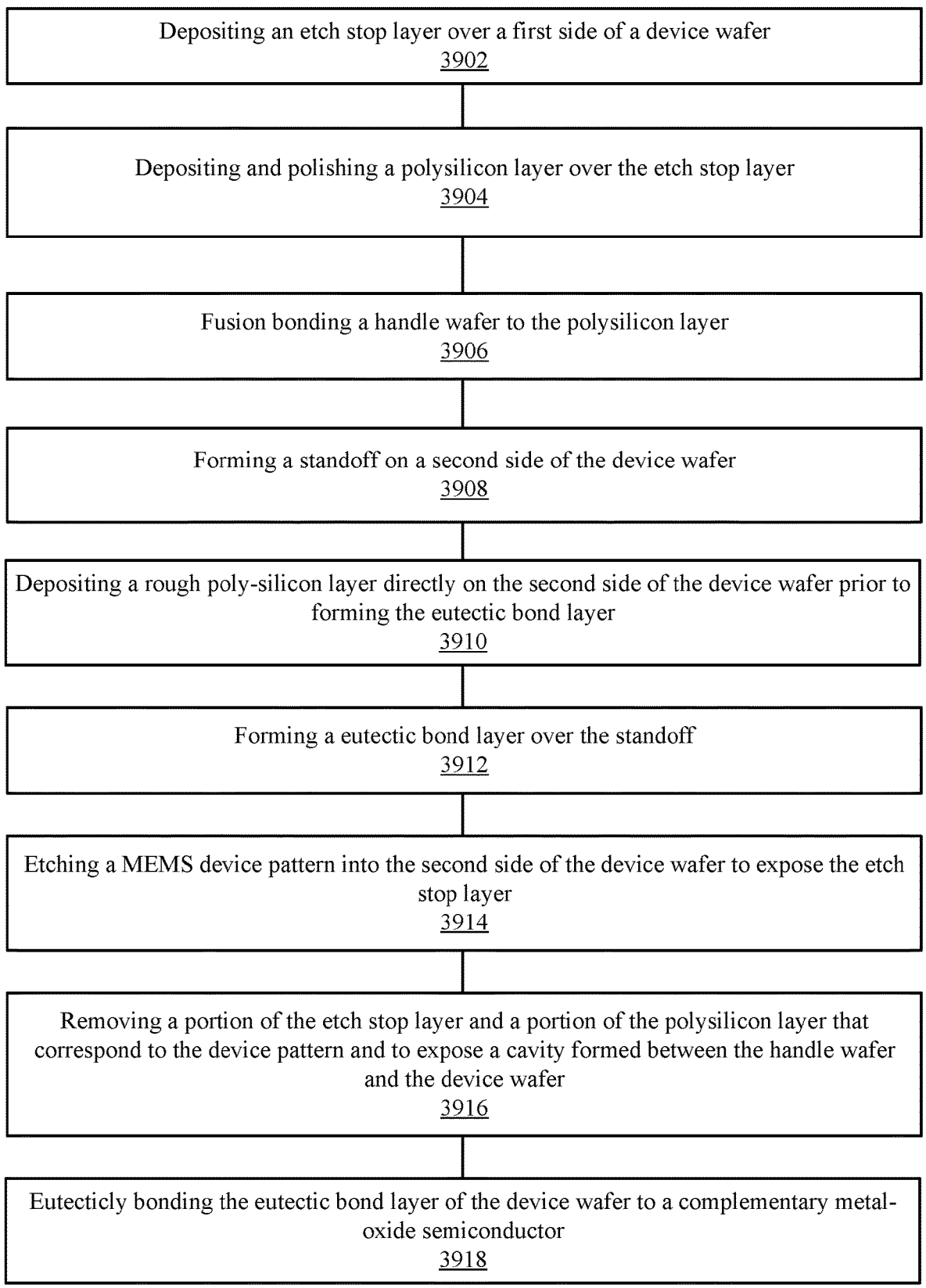
FIG. 39 shows an exemplary flow diagram for actuator layer patterning according to one aspect of the present embodiments.

FIG. 39 shows an exemplary flow diagram for actuator layer patterning according to one aspect of the present embodiments. At step 3902, an etch stop layer is deposited over a first side of a device silicon wafer, as described in FIG. 1. In some embodiments, the etch stop layer may be patterned, as described in FIGS. 2-4. At step 3904, a polysilicon layer is deposited over the etch stop layer, as described in FIGS. 5, 17, and 28. It is appreciated that if the etch stop layer is patterned, then the polysilicon layer covers the patterned etch stop layer as well as the exposed portion of the first side of the device wafer. At step 3906, a handle device wafer is fusion bonded to the device wafer (polysilicon layer), as described in FIGS. 6, 17, and 29. It is appreciated that in some embodiments, the handle device wafer may be coated with a fusion bond layer that faces the first side of the device wafer, as described in FIGS. 6 and 17 while in another embodiment a fusion bond layer is deposited on a top surface of the polysilicon layer, as described in FIG. 28. At step 3908, one or more standoffs are formed on the second side of the device wafer opposite to the first side, as described in FIGS. 7-9, 18-20, and 30-32. In some embodiments, at step 3910, a rough polysilicon layer is deposited directly on the second side of the device wafer, as described in FIGS. 10, 21, and 33. At step 3912, a eutectic bond layer is formed over the one or more standoff, as described in FIGS. 11, 22, and 34. At step 3914, a MEMS features are etched into the second side of the device wafer to expose the etch stop layer, as described in FIGS. 14, 25, and 37, using RIE or DRIE process. At step 3916, a portion of the etch stop layer and a portion of the polysilicon layer covering the portion of the etch stop layer that correspond to the features are removed to expose the cavity formed between the handle wafer and the device wafer, as described in FIGS. 15A, 26A, and 38A. At step 3918, the device wafer is eutecticly bonded to a CMOS.

In some embodiments where the interior surface of the cavity is covered with fusion bond layer, a SAM coating may be applied to cover the interior surface of the cavity and the features. In some embodiments, the fusion bond layer that covers the interior surface of the cavity is removed through VHF process and a SAM coating is applied after the removal of the fusion bond layer.

It is appreciated that the proposed process, as described, enables various features (i.e. actuator features) to release within a short amount of time, thereby reducing any tilting and/or bending and as a result reduces parametric degradation or device failures.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   depositing an etch stop layer over a first side of a device wafer;
   depositing and polishing a polysilicon layer over the etch stop layer;
   fusion bonding a handle wafer to the polysilicon layer;
   forming a standoff on a second side of the device wafer;
   forming a eutectic bond layer over the standoff;
   etching a micro-electro-mechanical system (MEMS) features into the second side of the device wafer to expose the etch stop layer; and
   removing a portion of the etch stop layer and a portion of the polysilicon layer that correspond to the features and to expose a cavity formed between the handle wafer and the device wafer.

2. The method of claim 1 further comprising depositing a rough poly-silicon layer directly on the second side of the device wafer prior to forming the eutectic bond layer.

3. The method of claim 1 further comprising patterning the etch stop layer.

4. The method of claim 3, wherein the polysilicon layer is formed over the patterned etch stop layer and is further formed over an exposed portion on the first side of the device wafer.

5. The method of claim 1 further comprising forming a fusion bond layer on a side of the handle wafer that is fusion bonded to the polysilicon layer.

6. The method of claim 5, wherein the fusion bond layer covers an interior surface of the cavity, and wherein the method further comprises forming a self-assembled monolayer (SAM) coating over the interior surface of the cavity that is coated with fusion bond layer, and further forming the SAM coating over the features.

7. The method of claim 5, wherein the fusion bond layer is an oxide layer.

8. The method of claim 5, wherein the fusion bond layer covers an interior surface of the cavity, and wherein the method further comprises removing the fusion bond layer from the interior surface of the cavity after removing the portion of the etch stop layer and the portion of the polysilicon layer.

9. The method of claim 8 further comprising using vapor hydrogen fluoride (VHF) to remove the fusion bond layer from the cavity.

10. The method claim 8 further comprising forming a self-assembled monolayer (SAM) coating over the interior surface of the cavity after removing the fusion bond layer from the interior surface of the cavity, and further forming the SAM coating over the features.

11. The method of claim 1, wherein the etch stop layer is a silicon dioxide.

12. The method of claim 1, wherein the eutectic bond layer comprises Ge.

13. The method of claim 1 further comprising forming a fusion bond layer over the polysilicon layer.

14. The method of claim 1 further comprising eutecticly bonding the eutectic bond layer of the device wafer to a complementary metal-oxide semiconductor (CMOS).

15. A method comprising:
    forming an etch stop layer over a first side of a device wafer;
    forming a polysilicon layer over the etch stop layer;
    fusion bonding a handle wafer to the first side of the device wafer;
    forming a eutectic bond layer on a second side of the device wafer;
    etching a micro-electro-mechanical system (MEMS) features into the second side of the device wafer to expose the etch stop layer;
    removing the exposed etch stop layer to expose the polysilicon layer; and
    removing the exposed polysilicon layer to expose a cavity formed between the handle wafer and the device wafer.

16. The method of claim 15 further comprising depositing a rough poly-silicon layer directly on the second side of the device wafer prior to forming the eutectic bond layer.

17. The method of claim 15 further comprising patterning the etch stop layer.

18. The method of claim 17, wherein the poly silicon layer is formed over the patterned etch stop layer and is further formed over an exposed portion on the first side of the device wafer.

19. The method of claim 15 further comprising forming a fusion bond layer on a side of the handle wafer that is fusion bonded to the polysilicon layer.

20. The method of claim 19, wherein the fusion bond layer is an oxide layer and covers an interior surface of the cavity, and wherein the method further comprises forming a self-assembled monolayer (SAM) coating over the interior surface of the cavity that is coated with fusion bond layer, and further forming the SAM coating over the features.

21. The method of claim 19, wherein the fusion bond layer covers an interior surface of the cavity, and wherein the method further comprises removing the fusion bond layer from the interior surface of the cavity after removing the exposed etch stop layer and the exposed polysilicon layer.

22. The method claim 21 further comprising forming a self-assembled monolayer (SAM) coating over the cavity after removing the fusion bond layer from the interior surface of the cavity, and further forming the SAM coating over the features.

23. The method of claim 15 further comprising forming a fusion bond layer over the polysilicon layer.

24. The method of claim 15 further comprising eutecticly bonding the eutectic bond layer of the device wafer to a complementary metal-oxide semiconductor (CMOS).

* * * * *